(12) United States Patent
Matsuyama

(10) Patent No.: US 6,639,651 B2
(45) Date of Patent: Oct. 28, 2003

(54) FABRICATION METHOD FOR CORRECTING MEMBER, FABRICATION METHOD FOR PROJECTION OPTICAL SYSTEM, AND EXPOSURE APPARATUS

(75) Inventor: Tomoyuki Matsuyama, Kitakatsushika-gun (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/014,136

(22) Filed: Dec. 13, 2001

(65) Prior Publication Data

US 2002/0105627 A1 Aug. 8, 2002

(30) Foreign Application Priority Data

Dec. 14, 2000 (JP) .......................... 2000-379674

(51) Int. Cl.[7] .................. G03B 27/68; G03B 27/72; G03B 27/32
(52) U.S. Cl. ................. 355/52; 355/71; 355/77
(58) Field of Search ................. 355/52, 53, 67, 355/71, 77

(56) References Cited

U.S. PATENT DOCUMENTS

| | | |
|---|---|---|
| 4,621,371 A | 11/1986 | Gotou et al. |
| 5,392,119 A | 2/1995 | McArthur et al. |
| 5,640,233 A | 6/1997 | McArthur et al. |
| 5,677,757 A | 10/1997 | Taniguchi et al. |
| 5,739,899 A | 4/1998 | Nishi et al. |
| 5,798,838 A | 8/1998 | Taniguchi et al. |
| 5,898,501 A | 4/1999 | Suzuki et al. |
| 5,929,991 A | 7/1999 | McArthur et al. |
| 5,995,263 A | 11/1999 | Tokuda et al. |
| 6,115,108 A * | 9/2000 | Capodieci .................... 355/77 |
| 6,235,438 B1 | 5/2001 | Suzuki et al. |
| 6,245,470 B1 * | 6/2001 | Kamon .......................... 430/30 |
| 6,259,174 B1 | 7/2001 | Ono |
| 6,262,793 B1 | 7/2001 | Sasaya et al. |
| 6,266,389 B1 | 7/2001 | Murayama et al. |
| 6,268,903 B1 | 7/2001 | Chiba et al. |
| 6,333,776 B1 | 12/2001 | Taniguchi |
| 2002/0001071 A1 * | 1/2002 | Nomura et al. ............... 355/52 |

FOREIGN PATENT DOCUMENTS

| | | |
|---|---|---|
| EP | 1 022 617 A2 | 7/2000 |
| EP | 1 024 522 A1 | 8/2000 |
| EP | 1 031 877 A1 | 8/2000 |
| JP | 8-203805 A | 8/1996 |

(List continued on next page.)

*Primary Examiner*—Rodney Fuller
(74) *Attorney, Agent, or Firm*—Oliff & Berridge, PLC

(57) ABSTRACT

A fabrication method for a projection optical system is capable of easily determining the corrected surface form as a desired continuous surface provided to a correcting member for correcting residual aberration. The fabrication includes: a measurement step of measuring aberration remaining in the projection optical system; a hypothesis step of hypothesizing a corrected surface form to be provided to the correcting member based on predetermined functions; a calculation step of calculating wavefront information of a light beam which passes through each of a plurality of regions on the correcting member having the corrected surface form hypothesized in the hypothesis step; and an evaluation step of evaluating the remaining aberration in the projection optical system when the hypothesized corrected surface form hypothesized in the hypothesis step is provided to the correcting member based on the measurement result in the measurement step and on the wavefront information calculated in the calculation step.

53 Claims, 12 Drawing Sheets

FOREIGN PATENT DOCUMENTS

| | | |
|---|---|---|
| JP | 8-288192 A | 11/1996 |
| JP | 9-92601 A | 4/1997 |
| JP | 9-148234 A | 6/1997 |
| JP | 9-237755 A | 9/1997 |
| JP | 10-38757 A | 2/1998 |
| JP | 10-38758 A | 2/1998 |
| JP | 10-142555 A | 5/1998 |
| JP | 10-294269 A | 11/1998 |
| JP | 11-45853 A | 2/1999 |
| JP | A-11-176744 | 7/1999 |
| JP | 11-328419 A | 11/1999 |
| JP | 11-345551 A | 12/1999 |
| JP | 2000-65526 A | 3/2000 |
| JP | 2000-97616 A | 4/2000 |
| JP | P2000-195778 A | 7/2000 |
| JP | 2000-249917 A | 9/2000 |
| JP | P2000-286178 A | 10/2000 |
| JP | 2000-286178 | 10/2000 |
| JP | 2001-168000 A | 6/2001 |

* cited by examiner

FABRICATION METHOD FOR CORRECTING MEMBER, FABRICATION METHOD FOR PROJECTION OPTICAL SYSTEM, AND EXPOSURE APPARATUS

INCORPORATION BY REFERENCE

The disclosure of the following priority application is herein incorporated by reference in its entirety: Japanese Patent Application No. 2000-379674 filed Dec. 14, 2000.

BACKGROUND OF THE INVENTION

1. Field of Invention

The invention relates to a fabrication method for a projection optical system and an exposure apparatus, or an adjustment method for a projection optical system and an exposure apparatus. In particular, the invention relates to correcting (adjusting) residual aberration in a projection optical system provided in an exposure apparatus for projection exposing a mask pattern onto a photosensitive substrate.

2. Description of Related Art

When fabricating a microdevice (e.g., semiconductor devices, liquid crystal display, thin film magnetic head, and the like) in a photolithography process, an exposure apparatus for projection exposing a mask (or reticle and the like) pattern onto a photosensitive substrate (workpiece) is used. In this type of exposure apparatus, because a mask pattern image is faithfully projected onto a photosensitive substrate with high resolution, projection optical systems are designed having excellent optical properties sufficient to restrict various aberrations.

However, the optical properties of projection optical systems used in manufactured exposure apparatus differ from their intended design, and various aberrations remain due to a variety of causes. As disclosed in, for example, U.S. Pat. No. 6,268,903, technology for correcting residual aberration uses a correcting optical member having a surface that is worked (shaped) in a predetermined form.

SUMMARY OF THE INVENTION

The invention addresses the above issues. It is one object of the invention to provide a fabrication method for a correcting member, a projection optical system and an exposure apparatus, that is capable of easily determining a corrected surface form to be provided to the correcting member for correcting residual aberration (unnecessary residual optical characteristics), as the desired continuous surface. It is another object of the invention to provide a fabrication method for a correcting member, a projection optical system, and an exposure apparatus, that excellently corrects predetermined aberrations (unnecessary residual optical characteristics) remaining, and that is capable of excellently controlling the side-effects of wavefront aberrations, and the like, which are generated secondarily associated with aberration correction (correction of optical characteristics). It is a further object of the invention to provide a microdevice fabrication method capable of fabricating highly precise microdevices using an exposure apparatus having a projection optical system having superior optical characteristics with excellently corrected residual aberrations (unnecessary residual optical characteristics).

In order to address the above and/or other problems, a first aspect of the invention provides a fabrication method for a correcting member for correcting residual aberration in a projection optical system which projects a first surface image onto a second surface, the fabrication method for the correcting member including: a measurement step of measuring aberration remaining in the projection optical system; a hypothesis step of hypothesizing, based on predetermined functions, a corrected surface form to be provided to the correcting member; a calculation step of calculating wavefront (transmission wavefront, and the like) information of a light beam which passes through each of a plurality of regions on the correcting member having the corrected surface form hypothesized in the hypothesis step; and an evaluation step of evaluating the remaining aberration in the projection optical system when the hypothesized corrected surface form hypothesized in the hypothesis step is provided to the correcting member based on the measurement result in the measurement step and on the wavefront (transmission wavefront, and the like) information calculated in the calculation step.

A second aspect of the invention provides a fabrication method for a projection optical system for projecting a first surface image onto a second surface, the fabrication method including: a measurement step of measuring residual aberration remaining in the projection optical system; a hypothesis step of hypothesizing a corrected surface form to be provided to a correcting member in order to correct the residual aberration in the projection optical system; a calculation step of calculating wavefront (transmission wavefront, and the like) information of a light beam which passes through each of a plurality of regions on the correcting member having the corrected surface form hypothesized in the hypothesis step; and an evaluation step of evaluating the aberration remaining in the projection optical system to be provided with the correcting member based on the measurement result in the measurement step and on the wavefront (transmission wavefront, and the like) information calculated in the calculation step.

According to a preferred embodiment for practicing the first and second aspects of the invention, the measurement step includes a first measurement step of measuring predetermined aberration remaining in the projection optical system, and a second measurement step of measuring wavefront aberration remaining in the projection optical system. Alternatively, it is preferred that the measurement step include a wavefront aberration measurement step of measuring wavefront aberration remaining in the projection optical system, and an extraction step of extracting predetermined aberration components by analyzing wavefront aberration measured in the wavefront aberration measurement step.

According to the preferred embodiment for practicing the first and second aspects of the invention, the measurement step measures each aberration at a plurality of measurement points in the projection visual field of the projection optical system. Also, it is preferred that the measurement step includes a step of measuring distortion aberration as the aberration. Additionally, it is preferred that the measurement step measures aberration remaining in the projection optical system with the correcting member set in the optical path before working, or that the measurement step measures aberration remaining in the projection optical system with the measuring member, having the same light characteristics as the correcting member before working, set in the optical path.

According to the preferred embodiment for practicing the first and second aspects of the invention, the evaluation step includes a first evaluation step of evaluating the predetermined aberration remaining in the projection optical system when the corrected surface form hypothesized in the hypothesis step is provided to the correcting member based on the measurement results of the predetermined aberration measured in the measurement step and on the wavefront (transmission wavefront, and the like) information calculated in the calculation step, and a second evaluation step of evaluating the wavefront aberration, not including the predetermined aberration component, remaining in the projection optical system when the corrected surface form hypothesized in the hypothesis step is provided to the correcting member based on the measurement results of wavefront (transmission wavefront, and the like) aberration measured in the measurement step and on the wavefront information calculated in the calculation step.

According to the preferred embodiment for practicing the first and second aspects of the invention, the calculation step includes an approximation step of approximating the corrected surface form with a Zernike function for each region of the correcting member having a corrected surface form hypothesized in the hypothesis step, and calculates changes in the wavefront of the light beam wavefront (transmission wavefront, and the like) which passes through each region based on the Zernike function approximated in the approximation step. Also, it is preferred that each region of the correcting member be the center of each evaluation point that the principle ray, shot into each measurement point in the projection optical field of the projection optical system, passes through the correcting member, and is defined as a region through which a light beam reaching the second surface, including the principle ray, will pass.

According to the preferred embodiment for practicing the first and second aspects of the invention, the hypothesis step hypothesizes a corrected surface form to be provided to the correcting member based on a Fourier function, a Zernike function and an exponential function. Also, it is preferred that the hypothesis step initially hypothesize a corrected surface form as a predetermined curved surface to be provided to the correcting member based on the measurement results in the measurement step, or that the hypothesis step initially hypothesize a corrected surface form as a plane to be provided to the correcting member.

According to the preferred embodiment for practicing the first and second aspects of the invention, the correcting member is an optical member with a plane-parallel form placed in the optical path between a lens component positioned on the first surface of the projection optical system and the first surface, or placed in the optical path between a lens component positioned on the second surface of the projection optical system and the second surface. Alternatively, it is preferred that the correcting member be a lens component placed on the first surface or the second surface of the projection optical system.

According to the preferred embodiment for practicing the first and second aspects of the invention, a corrected surface form decision process which obtains a final corrected surface form by modifying the parameters of the predetermined functions and repeating the hypothesis step, the calculation step and the evaluation step is included in order to improve residual aberrations in the projection optical system. In such a case, it is preferable that a working step be included for working (machining, polishing, and the like) the surface of the correcting member in order to provide to the correcting member a final corrected surface form obtained in the corrected surface form decision process. Alternatively, it is preferable that a working step be included to work (machining, polishing, and the like) the surface of the correcting member in order to provide to the correcting member a final corrected surface form obtained in the corrected surface form decision process, and a placement step of placing the correcting member, which has been worked in the working step, between the first surface and the second surface.

A third aspect of the invention provides a fabrication method for an exposure apparatus which includes a first placement step of placing a mask stage, to dispose a mask on the first surface, on a main body of an exposure apparatus; a second placement step of placing a substrate stage, to dispose a photosensitive substrate on the second surface, on the main body of an exposure apparatus; a third placement step of placing a projection optical system, fabricated according to the fabrication method in the second aspect of the invention, on the main body of an exposure apparatus; and a fourth placement step of placing an illumination system, for illuminating the mask placed on the first surface, on the main body of an exposure apparatus.

A fourth aspect of the invention provides a fabrication method for a microdevice which includes an exposure step of exposing the mask pattern onto a photosensitive substrate using an exposure apparatus fabricated according to the fabrication method in the third aspect of the invention, and a development step of developing the photosensitive substrate exposed in the exposure step.

A fifth aspect of the invention provides an adjustment method of an exposure apparatus having a projection optical system for projecting a mask pattern onto a photosensitive substrate, the adjustment method including: a measurement step of measuring remaining aberration in the projection optical system; a hypothesis step of hypothesizing, based on predetermined functions, a corrected surface form to be provided to a correcting member; a calculation step of calculating wavefront (transmission wavefront, and the like) information of a light beam which passes through each of a plurality of regions on the correcting member having the corrected surface form hypothesized in the hypothesis step; and an evaluation step of evaluating the remaining aberration in the projection optical system when the hypothesized corrected surface form hypothesized in the hypothesis step is provided to the correcting member based on the measurement result in the measurement step and on the wavefront information calculated in the calculation step.

According to a preferred embodiment for practicing the fifth aspect of the invention, the measurement step includes a first measurement step of measuring a predetermined aberration remaining in the projection optical system, and a second measurement step of measuring a wavefront aberration remaining in the projection optical system. Alternatively, the measurement step includes a wavefront form measurement step of measuring a wavefront aberration remaining in the projection optical system, and an extraction step of extracting predetermined aberration components by analyzing the wavefront aberrations measured in the wavefront aberration measurement step. Also, it is preferable that the measurement step measure each aberration in a plurality of measurement points in the projection optical field of the projection optical system. Additionally, it is preferable that the measurement step include a step of measuring distortion aberrations as aberrations.

According to the preferred embodiment for practicing the fifth aspect of the invention, the evaluation step includes a first evaluation step of evaluating the predetermined aberration remaining in the projection optical system when the corrected surface form hypothesized in the hypothesis step is provided to the correcting member based on the measurement results of the predetermined aberration measured in the measurement step, and on the wavefront information calculated in the calculation step, and a second evaluation step of evaluating the wavefront aberration, not including the predetermined aberration component, remaining in the projection optical system when the corrected surface form hypothesized in the hypothesis step is provided to the correcting member based on the measurement results of wavefront aberration measured in the measurement step and on the wavefront (transmission wavefront, and the like) information calculated in the calculation step.

According to the preferred embodiment for practicing the fifth aspect of the invention, the calculation step includes an approximation step of approximating the corrected surface form with a Zernike function for each region of the correcting member having a corrected surface form hypothesized in the hypothesis step, and calculates changes in the wavefront of the light beam wavefront (transmission wavefront, and the like) which passes through each region based on the Zernike function approximated in the approximation step. Also, it is preferable that each region of the correcting member is the center of each evaluation point which the principle ray, shot into each measurement point in the projection optical field of the projection optical system, passes through the correcting member defined as a region through which a light beam reaching the second surface, including the principle ray, will pass.

According to the preferred embodiment for practicing the fifth aspect of the invention, the hypothesis step hypothesizes a corrected surface form to be provided to the correcting member based on a Fourier function, a Zernike function and an exponential function. It is preferable that the hypothesis step initially hypothesize a corrected surface form as a predetermined curved surface to be provided to the correcting member based on the measurement results in the measurement step, or the hypothesis step initially hypothesize a corrected surface form as a plane to be provided to the correcting member.

According to the preferred embodiment for practicing the fifth aspect of the invention, the adjustment method includes a corrected surface form decision process which obtains a final corrected surface form by modifying the parameters of the predetermined functions and repeating the hypothesis step, the calculation step and the evaluation step in order to improve residual aberrations in the projection optical system. In such a case, it is preferable that the adjustment method include a working step to work (polishing, and the like) the surface of the correcting member in order to provide to the correcting member a final corrected surface form obtained in the corrected surface form decision process, and a placement step of placing the correcting member, which has been worked (polishing, and the like) in the working step, between the first surface and the second surface. The fifth aspect of the invention described above is an adjustment method for an exposure device, but may also be an adjustment method for a projection optical system.

A sixth aspect of the invention provides a fabrication method for a microdevice which includes an exposure step for exposing the mask pattern onto a photosensitive substrate using an exposure apparatus adjusted according to the adjustment method in the fifth aspect of the invention, and a development step for developing the photosensitive substrate exposed in the exposure step.

BRIEF DESCRIPTION OF THE DRAWINGS

The invention will be described with reference to the following drawings in which like reference numerals refer to like elements and wherein.

DETAILED DESCRIPTION OF PREFERRED EMBODIMENTS

The invention measures aberrations, distortion aberration and wavefront aberration for example, as unnecessary optical characteristics remaining in a projection optical system. Also, the invention hypothesizes, based on functions such as Fourier functions, for example, a corrected surface form to be provided to a correcting member. Then, the invention calculates wavefront information of a light beam which passes through each of a plurality of regions of the correcting member having the hypothesized corrected wave form. In particular, the invention approximates the corrected wavefront form of each region with a Zernike function, and calculates each change in the wavefront of a light beam which passes through each region based on an approximate Zernike function.

Next, based on the measurement results of distortion aberrations and wavefront aberrations, and calculated wavefront information, the invention analyzes aberrations remaining in a projection optical system when the hypothesized corrected wavefront form is provided to the correcting member. In particular, the invention evaluates the distortion aberration remaining in a projection optical system, and evaluates remaining wavefront aberration except for the distortion aberration component of a wavefront aberration. Additionally, as required, the invention obtains a final desired corrected surface form by modifying the parameters of the predetermined functions and repeating the hypothesis step, the calculation step and the evaluation step in order to improve residual aberrations in the projection optical system.

Thus, the invention hypothesizes a corrected surface form to be provided to the correcting member based on predetermined functions, and obtains a final desired corrected surface form by modifying, as required, the function parameters such that the distortion aberrations and the wavefront aberrations become sufficiently small. Thus, the fabrication method for a projection optical system and an exposure apparatus in the invention is capable of easily determining a desired corrected surface form as a continuous surface to be provided to the correcting member for correcting residual aberrations.

Also, the fabrication method for a projection optical system and an exposure apparatus in the invention is capable of excellently correcting predetermined aberrations such as remaining distortion aberration, and excellently managing the side-effects of wavefront aberrations, and the like, secondarily generated with aberration correction. Additionally, it is possible to manufacture a highly precise micro device using an exposure apparatus provided with a projection optical system fabricated or adjusted in accordance with the invention, in other words, using an exposure apparatus provided with a projection optical system having high optical characteristics with excellently corrected residual aberrations.

The preferred embodiments of the invention will be described referring to the diagrams.

Figure 1:
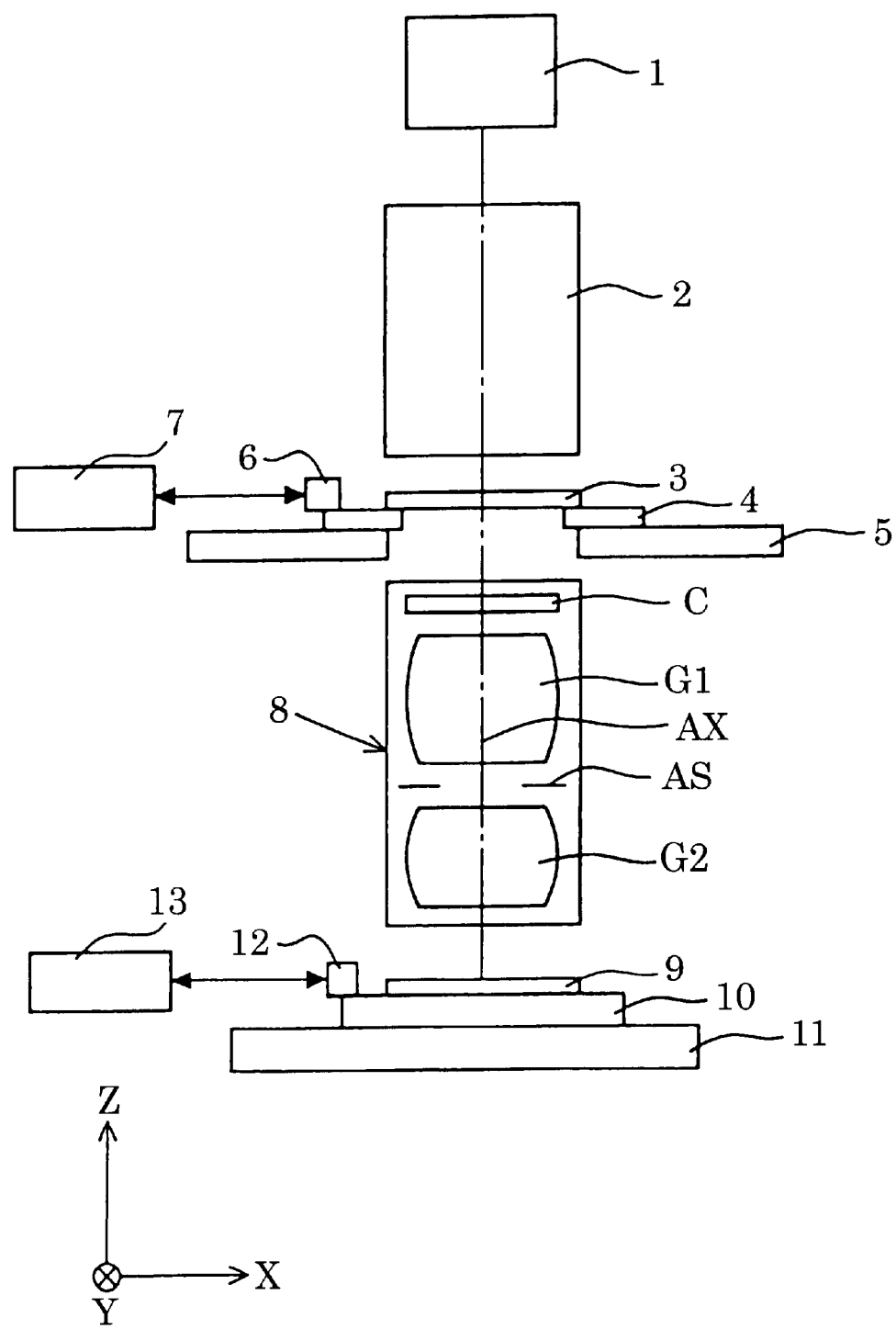
FIG. 1 is a schematic view showing the composition of an exposure apparatus provided with a projection optical system applying the fabrication method according to a preferred embodiment of the invention.

FIG. 1 is a schematic diagram showing the structure of an exposure apparatus provided with a projection optical system applying the fabrication method of the preferred embodiments of the invention. Moreover, in FIG. 1, the Z-axis is parallel to the optical axis AX of the projection optical system 8, the X-axis is parallel to the paper surface of FIG. 1 and the Y-axis is perpendicular to the paper surface of FIG. 1. The exposure apparatus shown is provided with an excimer laser light source for supplying a 248 nm (KrF) wavelength or a 193 nm (ArF) wavelength, for example, as a light source 1 for supplying exposure light (illumination light).

Light (radiation) supplied from the light source (radiation source) 1 illuminates the mask 3 formed with a predetermined pattern via the illumination optical system 2. The illumination optical system 2 has an optical integrator (an inner surface reflector-type rod member, fly-eye lens, micro lens array, or a diffraction optical element, and the like) for forming a secondary light source having a predetermined shape and size based on the light from the light source 1, and a field diaphragm for specifying the illumination region on the mask 3, and an imaging optical system for projecting the illumination field image onto the mask 3. The mask 3 is held parallel to the XY plane on the mask stage 5 via the mask holder 4. The mask stage 5 is capable of moving along the mask surface (i.e., in the XY plane) by the operation of a drive system omitted from the diagram, and is structured so as to measure the position coordinates with an interferometer 7 using the mask movable mirror 6 and to control the position thereof.

The light from the pattern formed on the mask 3 forms a mask pattern image on a wafer 9, which is a photosensitive substrate (workpiece), via the projection optical system 8. The wafer 9 is held parallel to the XY plane on the wafer stage 11 via the wafer holder 10. The wafer stage 11 is capable of movement along the wafer surface (i.e. the XY plane) by means of operation of a drive system omitted from the diagram, and is structured so as to measure the position coordinates with an interferometer 13 using the wafer movable mirror 12 and control the position.

Thus, the mask 3 pattern is consecutively exposed at each exposure region of the wafer 9 by batch exposure or by scanning exposure while drive controlling the wafer 9 on the plane (XY plane) perpendicular to the light axis AX of the projection optical system 8. As is known, batch exposure exposes the mask 3 pattern to each exposure region of the wafer 9, according to the so-called step-and-repeat method. On the other hand, scanning exposure scan exposes the mask 3 pattern to each exposure region of wafer 9 while synchronously moving the mask 3 and the wafer 9 relative to the projection optical system 8, according to the so-called step-and-scan method.

Beginning in order from the object side (i.e., the mask 3 side) as shown in FIG. 1, the projection optical system 8 in the preferred embodiment is comprised of the correcting member C formed into a parallel plane form, and the first portion of the optical system G1 comprised of a plurality of lenses, an aperture stop AS disposed in the entrance pupil position of the projection optical system 8, and the second portion of the optical system G2 comprised of a plurality of lenses. In the projection optical system 8, various aberrations are suppressed with the unworked correcting member C set in place, and is designed such that a superior image convergence function may be obtained.

However, due to various causes, aberration which should be adjusted may remain in an actual exposure apparatus of the projection optical system 8. In such a case, in the preferred embodiment, at least one surface (hereinafter, 'corrected surface') of the correcting member is worked, and aberrations remaining in the system are corrected by the correcting member C. Below, in order to simplify the explanation, the fabrication method for a projection optical system in the preferred embodiment will be explained as a means of correcting distortion aberrations remaining in the projection optical system 8 principally corrected by working the corrected surface on the mask side of the correcting member C.

Figure 2:
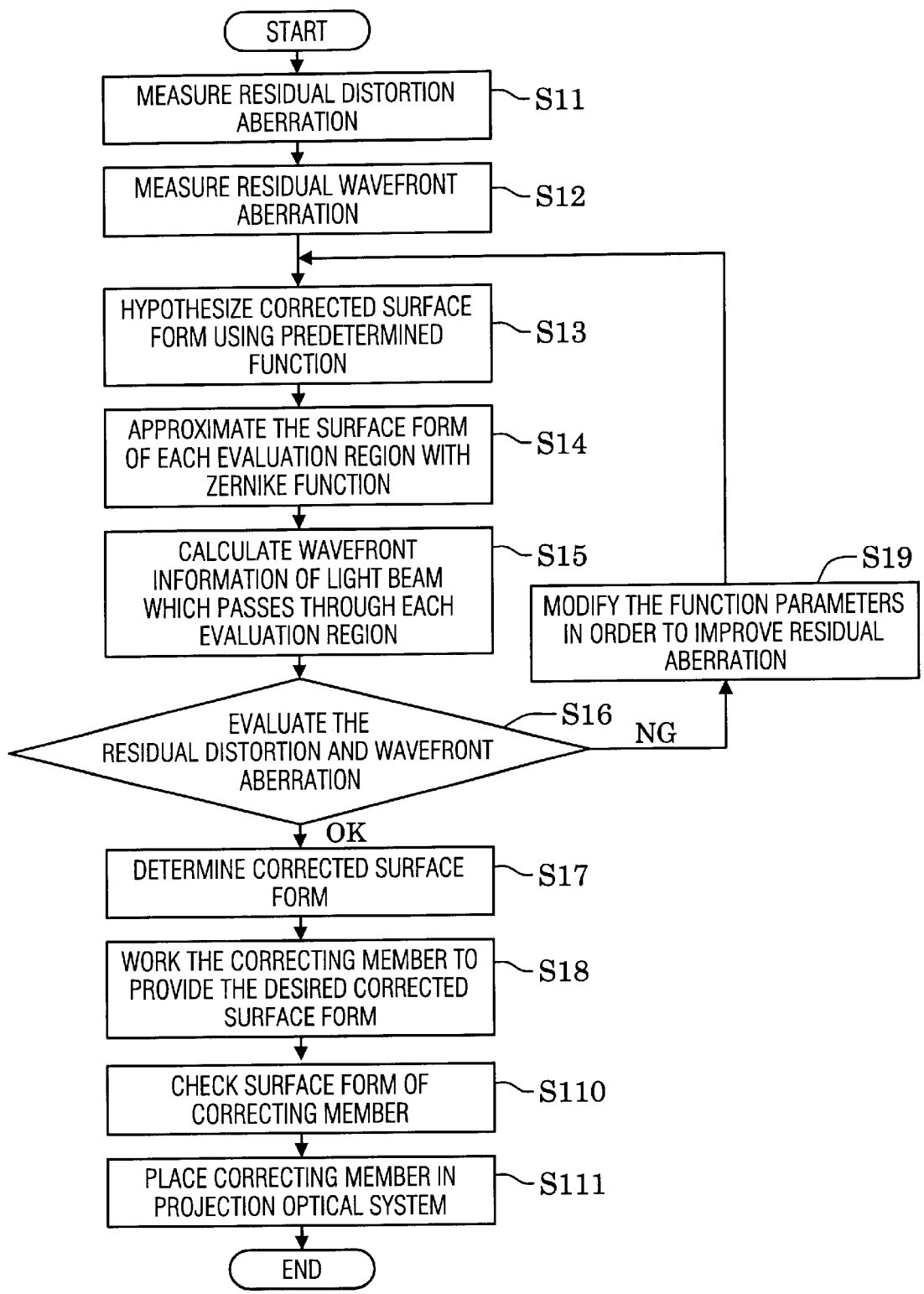
FIG. 2 is a flowchart showing the fabrication flow in the fabrication method for a projection optical system in the preferred embodiment.

FIG. 2 is a flowchart showing the fabrication flow in the fabrication method for a projection optical system in the preferred embodiment. As is shown in FIG. 2, distortion aberrations remaining in an actual projection optical system 8 are measured with the fabrication method of the preferred embodiment (S11). In particular, according to the test exposure (test bum) method as disclosed in, for example, U.S. Pat. No. 6,268,903, it is possible to measure residual aberrations in the projection optical system 8. With the test exposure method, a test mark (formed in an ideal grid) formed as a matrix form on a test mask is stationarily-exposed onto wafer 9 having a flatness that is specifically controlled via the projection optical system 8.

The disclosure of U.S. Pat. No. 6,268,903 is incorporated herein by reference in its entirety.

Next, the wafer 9 serving as an exposed photosensitive substrate is developed, and residual aberrations in the projection optical system 8 are measured by measuring the grid position of the test mark transmitted to wafer 9. In particular, each measurement point is the ideal position of the test mark, formed on the matrix form, to be transmitted to the matrix form on the wafer via a projection optical system in an ideal condition, and the quantity of position shift from each measurement point of the test mark actually transferred onto the wafer 9 is the quantity of aberration at each measurement point.

Figure 3:
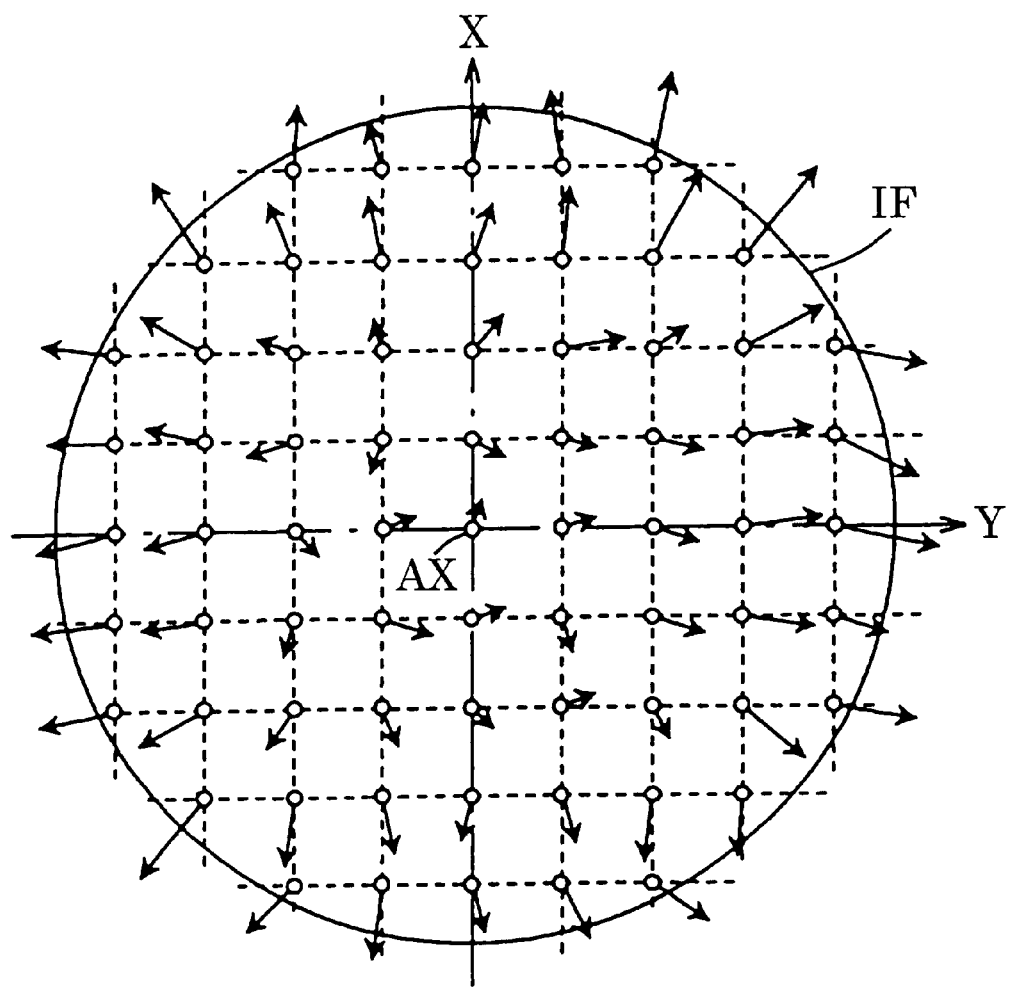
FIG. 3 shows the quantity of residual aberration measured at each measuring point specified in the matrix form in the projection field of the projection optical system.

Thus, as shown in FIG. 3, the quantity of residual distortion aberration (shown with arrows in the diagram) is measured at each measurement point (shown with small circles in the diagram) specified in the matrix form in the projection field IF of the projection optical system 8. Prior to the measurement step S11, the components subject to optical axis distortion aberrations are corrected beforehand by space adjustment of the optical members (lenses) comprising the projection optical system 8, shift adjustment of the optical member, and tilt adjustment. Therefore, the components shown in FIG. 3 are mainly random components of distortion aberration.

Moreover, when measuring residual distortion, test exposure is performed with the correcting member C, before working by local polishing and the like, disposed in a predetermined position (a position determined at the time of design) in the projection optical system 8. Alternatively, test exposure may be performed with a member for measuring having the same optical characteristics (shape, materials and the like) as the correcting member before working, in place of correcting member C. Also, the invention is not limited by the method of test exposure; it is possible, for example, to measure residual aberrations in a projection optical system 8 using a spatial image detector (e.g., a CCD—not shown) disposed on the wafer stage 11.

With the method using the spatial image detector, a test mark formed into a matrix shape on the test mask is illuminated with exposure illumination light, and a spatial image of the test mark is formed on the image surface via the projection optical system 8. Then, the wafer stage 11 is moved two dimensionally in the X and Y directions such that the spatial image is scanned by the spatial image detector, and the residual aberrations in the projection optical system 8 are measured by analyzing the wave form of the photoelectric signal output from the spatial image detector at that time. The technique of measuring residual aberrations in an optical system using a spatial image detector is disclosed in, for example, U.S. Pat. No. 5,798,838, the disclosure of which is incorporated herein by reference in its entirety.

Figure 4:
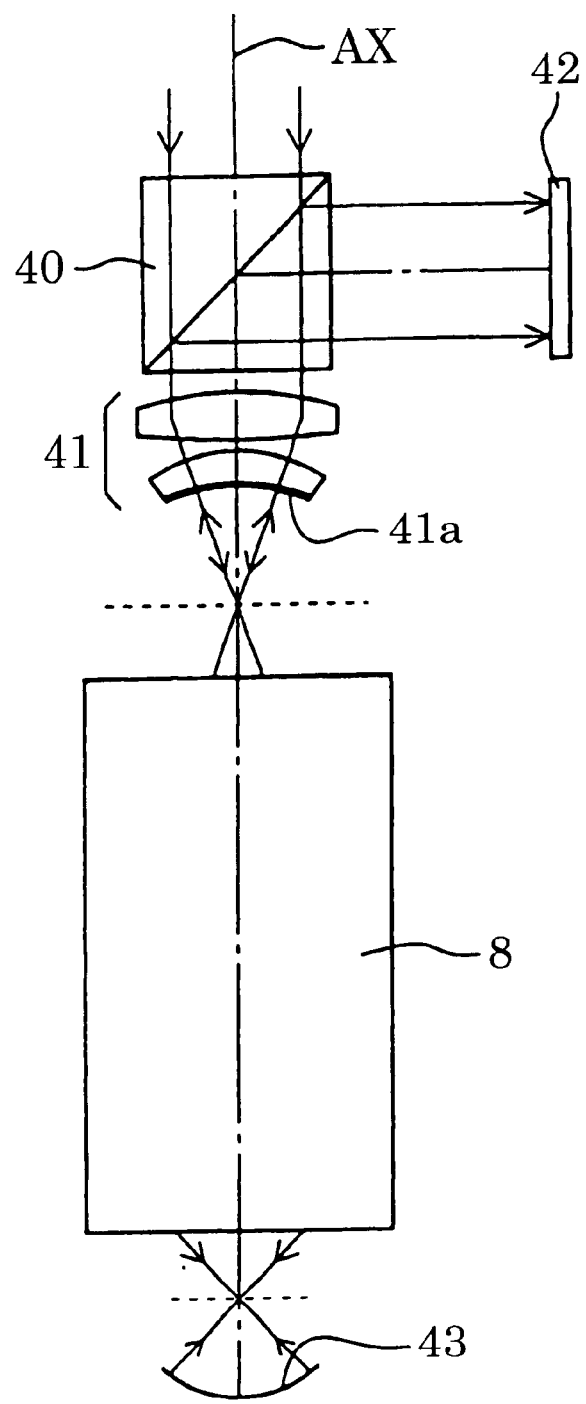
FIG. 4 is a schematic view showing the composition of the wavefront aberration measuring device using a Fizeau interferometer method for measuring wavefront aberrations in a projection optical system using a KrF excimer laser light source.

Also, with the fabrication method in the preferred embodiment, the wavefront aberrations remaining in a real projection optical system 8 are measured (S12). In particular, using a Fizeau interferometer method in a wavefront aberration measurement instrument disclosed in, for example, U.S. Pat. No. 5,898,501, it is possible to measure the wavefront aberrations in projection optical systems using a KrF excimer laser light source. In such a case, as shown in FIG. 4, laser light (secondary harmonics Ar laser light, for example) having nearly the same wavelength as the exposure light is shot into the projection optical system 8 serving as a test optical system via the half prism 40 and the Fizeau surface 41a of the Fizeau lens 41. At this point, the light reflected at Fizeau surface 41a, becoming the so-called reference light, arrives at an image pickup device 42 such as a CCD via the Fizeau lens 41 and the half prism 40.

The disclosure of U.S. Pat. No. 5,898,501 is incorporated herein by reference in its entirety.

On the other hand, the light passed through the Fizeau surface 41a, becoming the so-called measurement light, is shot into the reflective spherical surface 43 via the projection optical system 8. The measurement light reflected at the reflective spherical surface 43 arrives at CCD 42 via the projection optical system 8, the Fizeau lens 41 and the half prism 40. Thus, the wavefront aberrations remaining in the projection optical system 8 are measured based on the interference between the reference light and the measured light. Similarly, using a Fizeau interferometer method wavefront aberration measurement instrument disclosed in, for example, Japanese Laid-Open Patent Application Publication No. 10-38758, it is possible to measure the wavefront aberrations of projection optical systems using an extra-high pressure mercury lamp (i line for example).

Figure 5:
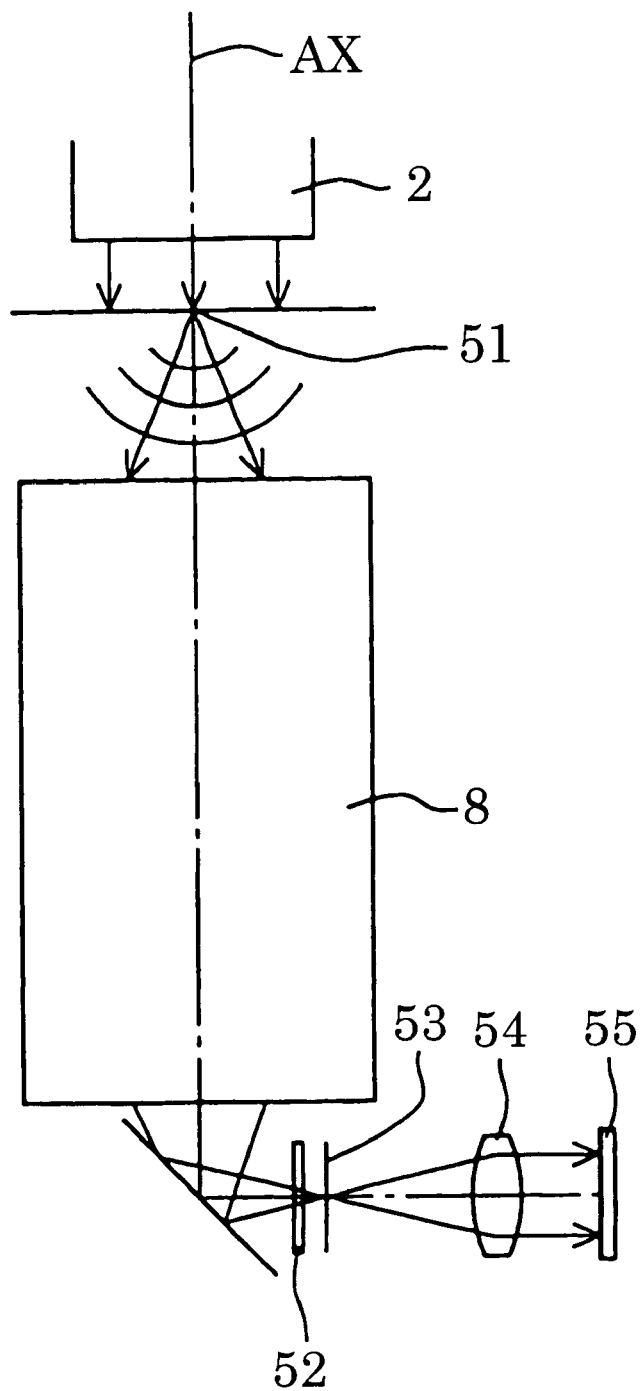
FIG. 5 is a schematic view showing the composition of the wavefront aberration measuring device using a PDI method for measuring wavefront aberrations in a projection optical system using an ArF excimer laser.

Also, using a so-called phase diffraction interferometer (PDI) method in a wavefront aberration measuring instrument disclosed in, for example, Japanese Laid-Open Patent Application Publication No. 2000-97616, it is possible to measure the wavefront aberrations of projection optical systems with an ArF excimer laser light source. In such a case, as shown in FIG. 5, the illumination light for exposure via the illumination optical system 2 shot from the light source (not shown in FIG. 5) is shot into a first pinhole 51 positioned on the mask setting position. The spherical surface wave formed via the first pinhole 51 passes through the projection optical system 8 serving as a test optical system, and is shot into the grating (single dimension diffraction grating) 52.

Zeroth order diffracted light transmitted through the grating 52 without change is shot into the second pinhole (not shown) formed on the mask 53. On the other hand, the first order diffracted light generated from the diffraction effect at the grating 52 is shot into nearly the center of the aperture member (not shown) formed on the mask 53. The first order diffracted light passing through the zeroth order diffracted light and through the aperture member via the second pinhole arrives at an image pickup device 55 such as a CCD via a collimator lens 54. Thus, the spherical surface wave formed via the second pinhole is the reference wavefront, and the wavefront of the first order diffracted light passed through the aperture member is the measured wavefront, and the wavefront aberrations remaining in the projection optical system 8 are measured based on the interference of the reference wavefront and the measured wavefront.

Moreover, in the explanation above, distortion aberrations remaining in the projection optical system are measured via a test exposure or by using a spatial image sensor, and wavefront aberrations remaining in the projection optical system are measured using a wavefront measurement device. However, it is possible to extract distortion aberration components remaining in the projection optical system by measuring wavefront aberrations using a wavefront aberration measurement device and analyzing measured wavefront aberrations. Below, distortion aberrations remaining in the projection optical system are measured via a test exposure, and wavefront aberrations remaining in the projection optical system are measured using a wavefront aberration measurement device.

Figure 6:
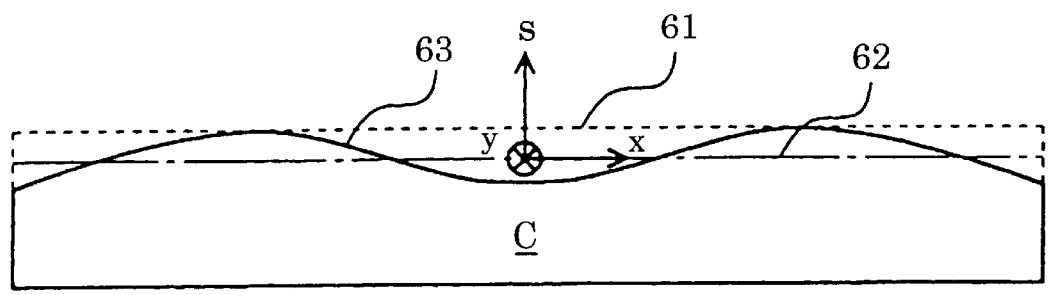
FIG. 6 shows the condition of hypothesizing the corrected surface form to be provided to the whole corrected surface of the correcting member based on predetermined functions.

Next, in the fabrication method of the preferred embodiment, the corrected surface form to be provided to the correcting member C is hypothesized based on a predetermined function (S13). FIG. 6 is a diagram explaining the condition of hypothesizing a corrected form to be provided to the full corrected surface of the correcting member based on a predetermined function. FIG. 6 depicts an imaginary standard surface 62 on the correcting member C parallel to the corrected surface 61 before working by local polishing, and the like. The point where the imaginary standard surface 62 and the light axis AX intersect is the point of origin, the s-axis is set in the normal direction of the imaginary standard surface 62, the x-axis is set parallel to the paper surface of FIG. 6, and the y-axis is set perpendicular to the paper surface of FIG. 6.

In the preferred embodiment, the full surface form of corrected surface 63 to be provided to the correcting member C using function S is hypothesized as shown in the following equation (1).

$$s = S(x, y)$$

It is possible to use a Fourier function, a Zernike function, an exponential function, and the like as function S. In the preferred embodiment, the Fourier function shown in equation (2) is used as the S function for hypothesizing the complete surface form of the corrected surface 63 to be provided to the correcting member C. In addition, in equation (2), m and n are integers equal to or greater than 1, and sigma is a symbol signifying addition concerning m and n.

Function 1

$$S(x, y) = \sum \{A_{mn}\cos(mx)\cos(ny) + B_{mn}\cos(mx)\sin(ny) + C_{mn}\sin(mx)\cos(ny) + D_{mn}\sin(mx)\sin(ny)\} \quad (2)$$

In particular, it is possible to initially hypothesize, as a plane, the full surface form of corrected surface 63 to be provided to correcting member C. In such a case, the parameters $A_{mn}$–$D_{mn}$ of the Fourier function represented by equation (2) are all 0. Alternatively, it is also possible to initially hypothesize, as a predetermined curved surface, the full surface form of corrected surface 63 to be provided to correcting member C based on the residual aberrations measured in the measurement step S11 or the measurement step S12.

Figure 7:
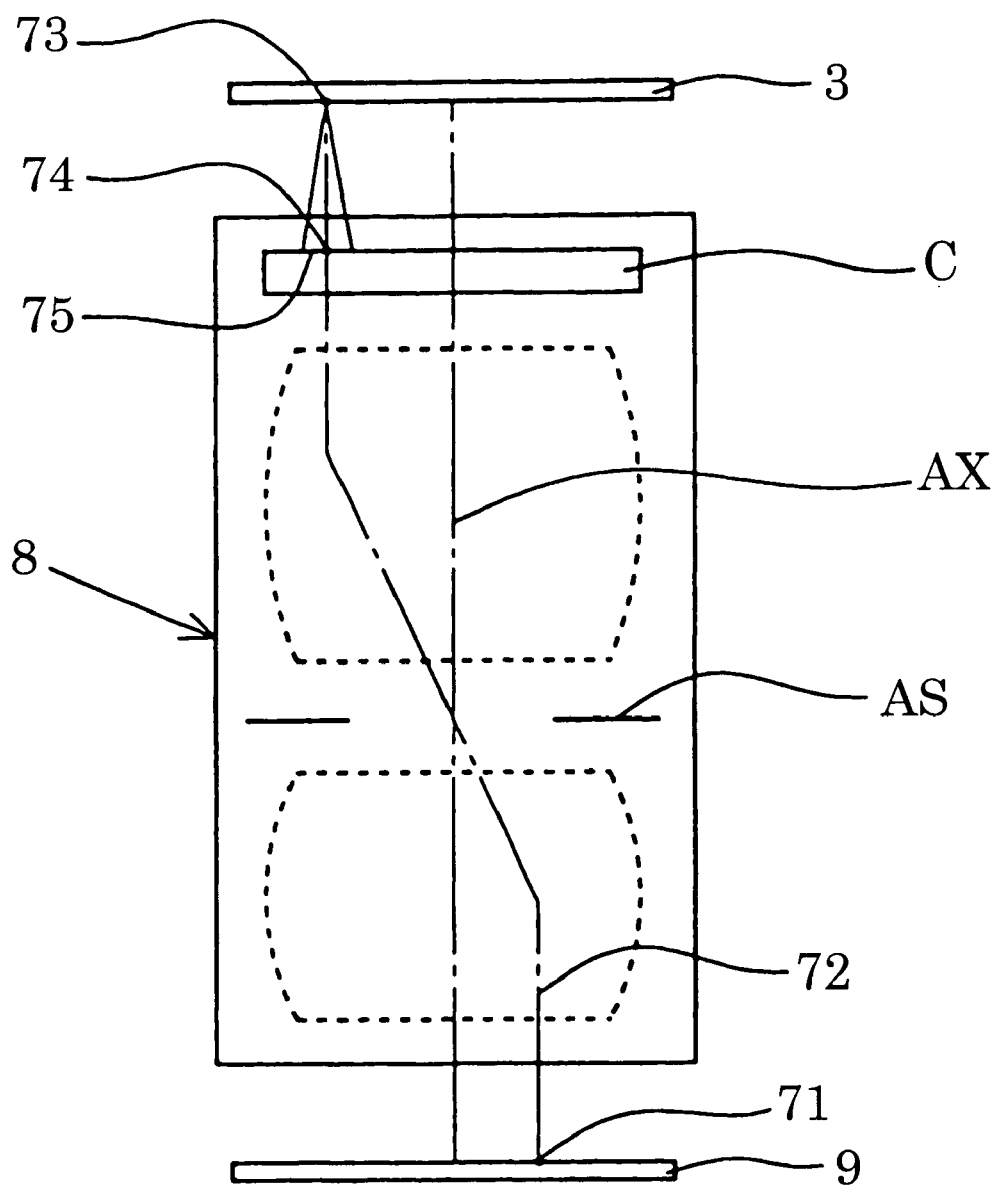
FIG. 7 describes an evaluation point and its evaluation region specified on the corrected surface of the correcting member.

Next, with the fabrication method of the preferred embodiment, the surface form of each evaluation region on the corrected surface of correcting member C having the surface form hypothesized in the hypothesis step S13 is approximated (Zernike fitting) with the Zernike function (step S14). FIG. 7 shows each evaluation point and each evaluation region specified on the corrected surface of the correcting member. In FIG. 7, take note of the principle ray 72 shot into one measurement point 71 in the projection field of the projection optical system 8. In such a case, the principle ray 72 passes through a point 74 (hereinafter called 'evaluation point') on the corrected surface of the correcting member from one point 73 on the mask 3, and after intersecting with the light axis AX in the aperture stop AS position, is shot into the measurement point 71.

Figure 8:
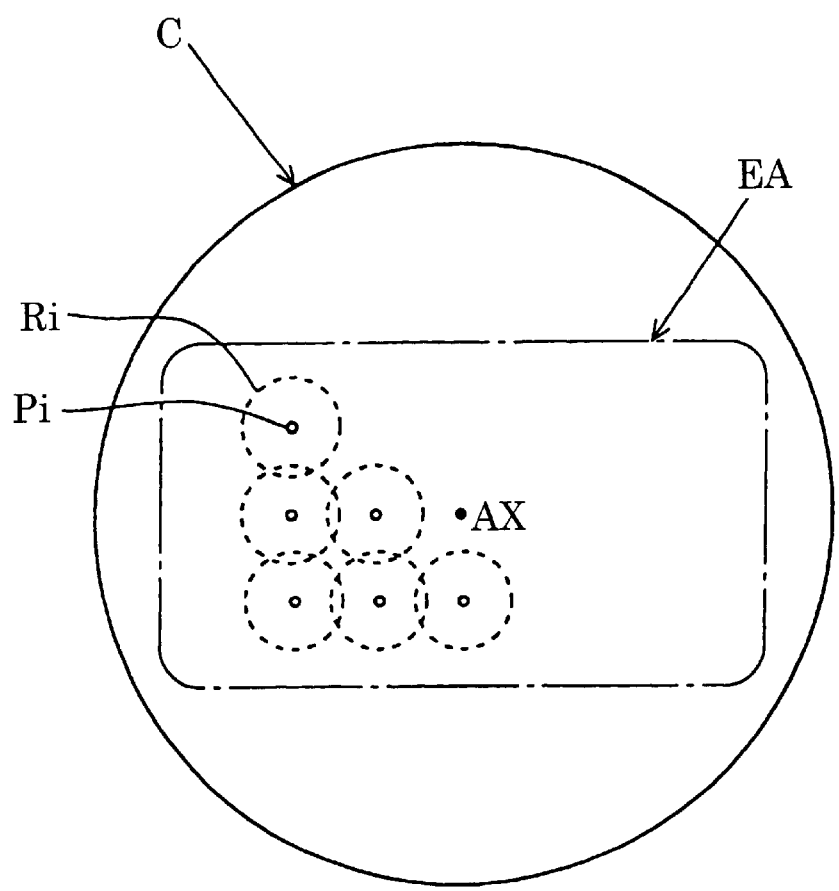
FIG. 8 is a schematic view showing the composition of each evaluation point and each evaluation region specified on the corrected surface of the correcting member.

On the other hand, the light from the one point 73 on the mask 3 also is shot into the cylindrical evaluation region 75 with the evaluation point 74 at the center of the corrected surface of the correcting member C in accordance with the aperture number. FIG. 8. is an outline view of each evaluation point and the composition of each evaluation point specified on the corrected surface of the correcting member. As shown in FIG. 8, each evaluation point Pi corresponding to each measurement point in the effective area EA on the corrected surface of the correcting member is specified on the matrix form. Also, each evaluation region Ri is specified based on the aperture number with each evaluation point Pi at the center. Moreover, in FIG. 8, only a portion of the evaluation points and corresponding evaluation regions are shown in order to clarify the diagram.

Thus, with the preferred embodiment, the surface form S' of each evaluation region Ri is Zernike fitted as shown in the following equation (3).

$$S' = Z1 \cdot f1 + Z2 \cdot f2 + \ldots + Z36 \cdot f36 \quad (3)$$

Basic items concerning Zernike functions (i.e., Zernike polynomials) will be explained. In a Zernike function, polar coordinates are used as a coordinate system, and Zernike cylindrical functions are used as an orthogonal function system. Polar coordinates are set on each evaluation region Ri, and the surface form is represented by S' ($\rho$, $\theta$) where $\rho$ is the standardized radius of each evaluation region Ri standardized 1, and $\theta$ is the radius vector angle of the polar coordinates. Surface form S' ($\rho$, $\theta$), using the Zernike cylindrical function system fn ($\rho$, $\theta$), is represented as shown in equation 4.

Function 2

$$S'(\rho, \theta) = Z1 \cdot f1(\rho, \theta) + Z2 \cdot f2(\rho, \theta) \ldots + Zn \cdot fn(\rho, \theta) \quad (4)$$

Z1–Zn are expansion coefficients, i.e., Zernike coefficients. The above-described equation (3) matches the expression limiting the number of terms n in the Zernike polynomial to 36 in equation (4). Below, the number of terms in the Zernike function are illustratively set at 36 in the preferred embodiment. Of the Zernike cylindrical function systems fn($\rho$, $\theta$), the cylindrical function systems f1–f36 in items 1–36 are as follows.

n: fn ($\rho$, $\theta$)
1: 1
2: $\rho\cos\theta$
3: $\rho\sin\theta$
4: $2\rho^2 - 1$
5: $\rho^2\cos2\theta$
6: $\rho^2\sin2\theta$
7: $(3\rho^2 - 2)\,\rho\cos\theta$
8: $(3\rho^2 - 2)\,\rho\sin\theta$
9: $6\rho^4 - 6\rho^2 + 1$
10: $\rho^3\cos3\theta$
11: $\rho^3\sin3\theta$
12: $(4\rho^2 - 3)\,\rho^2\cos2\theta$
13: $(4\rho^2 - 3)\,\rho^2\sin2\theta$
14: $(10\rho^4 - 12\rho^2 + 3)\,\rho\cos\theta$
15: $(10\rho^4 - 12\rho^2 + 3)\,\rho\sin\theta$
16: $20\rho^6 - 30\rho^4 + 12\rho^2 - 1$
17: $\rho^4\cos4\theta$
18: $\rho^4\sin4\theta$
19: $(5\rho^2 - 4)\,\rho^3\cos3\theta$
20: $(5\rho^2 - 4)\,\rho^3\sin3\theta$
21: $(15\rho^4 - 20\rho^2 + 6)\,\rho^2\cos2\theta$
22: $(15\rho^4 - 20\rho^2 + 6)\,\rho^2\sin2\theta$
23: $(35\rho^6 - 60\rho^4 + 30\rho^2 - 4)\,\rho\cos\theta$
24: $(35\rho^6 - 60\rho^4 + 30\rho^2 - 4)\,\rho\sin\theta$
25: $70\rho^8 - 140\rho^6 + 90\rho^4 - 20\rho^2 + 1$
26: $\rho^5\cos5\theta$
27: $\rho^5\sin5\theta$
28: $(6\rho^2 - 5)\,\rho^4\cos4\theta$
29: $(6\rho^2 - 5)\,\rho^4\sin4\theta$
30: $(21\rho^4 - 30\rho^2 + 10)\,\rho^3\cos3\theta$
31: $(21\rho^4 - 30\rho^2 + 10)\,\rho^3\sin3\theta$
32: $(56\rho^6 - 104\rho^4 + 60\rho^2 - 10)\,\rho^2\cos2\theta$ 33: $(56\rho^6-104\rho^4+60\rho^2-10)\rho^2\sin2\theta$ 34: $(126\rho^8-280\rho^6+210\rho^4-60\rho^2+5)\rho\cos\theta$ 35: $(126\rho^8-280\rho^6+210\rho^4-60\rho^2+5)\rho\sin\theta$ 36: $252\rho^{10}-630\rho^8+560\rho^6-210\rho^4+30\rho^2-1$ Next, in the preferred embodiment of the fabrication method, the wavefront information of the light beam, which passes through each evaluation region on the correcting surface of the correcting member C, is calculated (S15). Here, the transmission wavefront change W according to the wavefront form of each evaluation region is described with the following equation (5) based on the Zernike function.

$$W=Z2'\cdot f2+Z3'\cdot f3 \ldots +Z36'\cdot f36 \quad (5)$$

When the refraction ratio of the optical material forming the correcting member C between the Zernike coefficient Zn (n=2–36) in the Zernike function S' showing the wavefront form of each evaluation region and the Zernike coefficient Zn' (n=2–36) in the Zernike function W showing the transmission wavefront change from the wavefront form of each evaluation region is N, then the proximity relation shown in the following equation (6) is satisfied.

$$Zn'\cong(N-1)\cdot Zn \quad (6)$$

Figure 9:
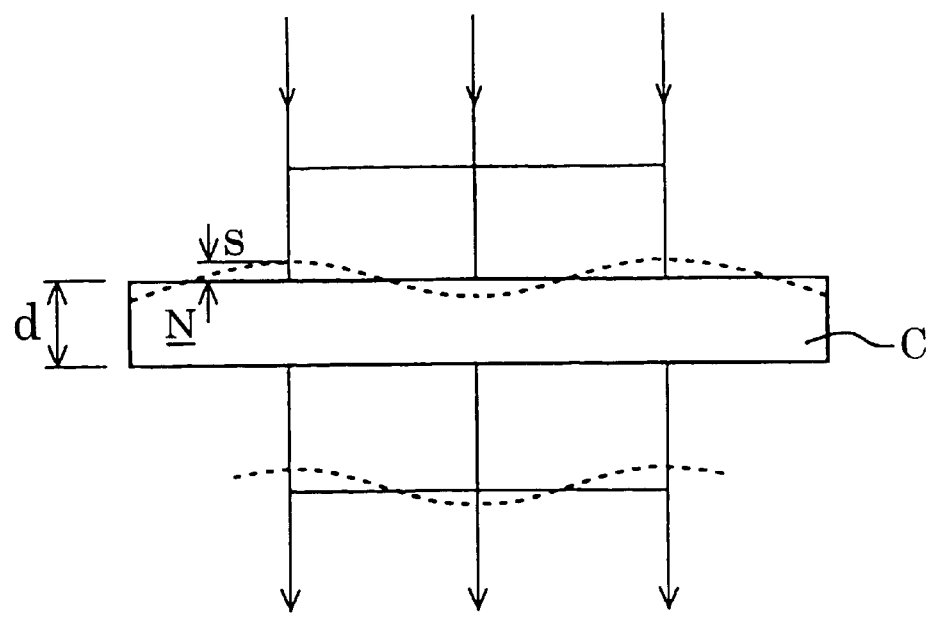
FIG. 9 describes the relationship between the Zernike coefficient Zn in the Zernike function S' representing each evaluation region of the surface form and the Zernike coefficient Zn' in the Zernike function W representing the change in the transmission wavefront from each evaluation region of the surface form.

FIG. 9 describes the relationship between the Zernike function Zn in the Zernike function S' representing the wavefront form of each evaluation region and the Zernike function Zn' in the Zernike function W representing the change in transmission wavefront of the wavefront form of each evaluation region. In FIG. 9, when considering the case of shooting a parallel light beam into the correcting member C, the plane form is a transmission wavefront when the corrected surface is being formed into a plane form, however, the transmission wavefront changes in accordance with the change in optical path length when the corrected surface is formed into a curved surface shape.

The length of the optical path of the correcting member C formed into a curved surface by the corrected surface is represented by N (d+s) where the reference thickness of the correcting member C is d and the sag quantity from the reference thickness surface (in accordance with the virtual reference surface of FIG. 6) is s. On the other hand, the optical path length corresponding to when the corrected surface is formed into a plane form along the reference thickness surface is represented by N·d+s. Therefore, the optical path length difference ΔL is represented in the following equation (7):

$$\Delta L=N(d+s)-(N\cdot d+s)=(N-1)s \quad (7)$$

In reality, a parallel light beam is not shot into the correcting member C, but since the aperture number NA on the object side is small, the proximity relation shown in equation (6) is satisfied in reference to the relationship obtained by equation (7) between the Zernike function Zn in the Zernike function S' representing the wavefront form of each evaluation region and the Zernike function Zn' in the Zernike function W representing the change in transmission wavefront of the wavefront form of each evaluation region. Thus, in the preferred embodiment, it is possible to calculate the change in the transmission wavefront of the wavefront form of each evaluation region based on the Zernike coefficient in the Zernike function representing the wavefront of each evaluation region when Zernike fitting the wavefront form of each evaluation region on the correcting surface of the correcting member C.

Figure 10:
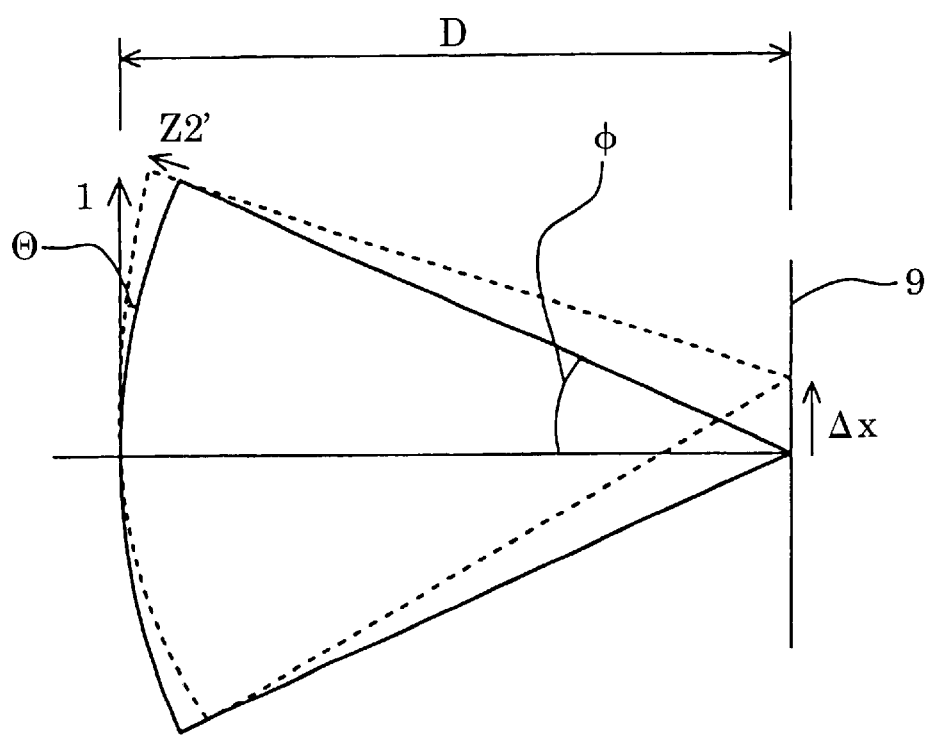
FIG. 10 shows the position shift from the measurement point corresponding to the point where the light beam, which passed through each evaluation region of the correcting member, forms an image on the wafer surface.

Next, the fabrication method of the preferred embodiment evaluates (S16) the residual distortion aberration and the residual wavefront aberration remaining in the projection optical system 8 when the corrected surface form hypothesized in the hypothesis step is provided to the correcting member C, based on the measurement results from the measurement step S11 and the measurement step S12, and the transmission wavefront calculated in the calculation step S15. FIG. 10 shows the position slip from the measurement point corresponding to the image convergence point on the wafer surface where the light beam passes through each evaluation region of the correcting member C. In FIG. 10, Δx is the quantity of position shift from the measurement point along the direction optically corresponding to the x coordinate of the local grid on the correcting member C. The angle corresponding to the aperture number NA on the image side (wafer side) of the projection optical system 8 is Ψ.

Thus, referring to FIG. 10, the relationship shown in the following equations (8)~(10) are obtained.

$$\Delta x = D\cdot\theta \quad (8)$$

$$NA=\sin\Psi=1/D \quad (9)$$

$$\theta=Z2' \quad (10)$$

Thus, the quantity of position shift Δx is shown in the following equation (11).

$$\Delta x = Z2'/NA \quad (11)$$

Similarly, the quantity of position shift Δy from the measurement point along the direction optically corresponding to the y coordinate of the local coordinates on the correcting member C is shown in the following equation (12)

$$\Delta y = Z3'/NA \quad (12)$$

With the preferred embodiment, the x direction component $dx_i$ and the y direction component $dy_i$, of the residual distortion aberration at each measurement point Qi corresponding to each evaluation point Pi of the correcting member C, are measured beforehand in the measurement step S11. Also, the x direction component $dx_i$ and the y direction component $dy_i$, of the residual distortion aberration corrected (changed) at each measurement point Qi by the effect of each evaluation region Ri of the correcting member C, are obtained respectively from the above equations (11) and (12).

Therefore, the x direction component $dx_i$ and the y direction component $dy_i$, of the residual distortion aberration remaining at each measurement point Qi of the optical field of the projection optical system 8 when the corrected surface form hypothesized in the hypothesis step S13 is provided to the correcting member C, are shown respectively in the following equations (13) and (14).

$$\delta x_i=(dx_i+\Delta x_i) \quad (13)$$

$$\delta y_i=(dy_i+\Delta y_i) \quad (14)$$

On the other hand, the residual wavefront aberration Wi, not including the distortion aberration component of the residual wavefront aberration of the light beam which passes though each evaluation region Ri on the correcting member C and is collected at each measurement point Qi, is measured beforehand in the measurement step S12, however, the residual wavefront aberration Wi is expressed in the following equation (15).

$$Wi=Z4_i\cdot f4+Z5_i\cdot f5 \ldots +Z36_i\cdot f36 \quad (15)$$

Also, the wavefront aberration $\Delta Wi$, not including the distortion aberration component of the wavefront aberration to be corrected (change) at each measurement point Qi by the effect of each evaluation region Ri on the correcting member C, is expressed in the following equation (16) with reference to equation (15) above.

$$\Delta Wi = Z4_i' \cdot f4 + Z5_i' \cdot f5 \ldots + Z36_i' \cdot f36 \qquad (16)$$

Therefore, the wavefront aberration $\delta Wi$, not including the distortion aberration component of the wavefront aberration remaining at each evaluation point Qi in the projection field of the projection optical system 8 when the corrected surface form hypothesized in the hypothesis step S13 is provided to the correcting member C, is shown in the following equation (17).

$$\delta Wi = Wi + \Delta Wi = (Z4_i + Z4_i') \cdot f4 + (Z5_i + Z5_i') \cdot f5 + \ldots + (Z36_i + Z36_i') \cdot f36 \qquad (17)$$

With the preferred embodiment, the x direction component $dx_i$ and the y direction component $dy_i$ of the residual distortion aberration remaining at each measurement point Qi is evaluated. Also, the residual wavefront aberration $\delta Wi$ at each evaluation point Qi is evaluated. In particular, in order to evaluate the remaining distortion aberration, which remains in the projection optical system 8 when the corrected surface form hypothesized in the hypothesis step S13 is provided to the correcting member C, the first evaluation function shown in equations (18) and (19) are introduced. Moreover, $\Sigma$ is summation notation for $i=1\sim k$, and k is the number of evaluation points Pi in the effective area of the correcting member C.

$$\Sigma |(dx_i + \Delta x_i)| \qquad (18)$$

$$\Sigma |(dy_i + \Delta y_i)| \qquad (19)$$

Also, in order to evaluate the residual wavefront aberration, not including the distortion aberration component of the wavefront aberration which remains in the projection optical system 8 when the corrected surface form hypothesized in the hypothesis step S13 is provided to the correcting member C, the second evaluation function shown in equation (20) is introduced. Moreover, in the equation (20), the $\Sigma$ on the left is summation notation for $i=1\sim k$, and the $\Sigma$ on the right is a summation notation for $j=4\sim 36$.

$$\Sigma\Sigma |(Zj_i + Zj_i')| \qquad (20)$$

With the preferred embodiment, in the case that the first evaluation function and the second evaluation function are smaller that their respective predetermined specified values, following the OK arrow in FIG. 2, the surface form initially hypothesized in the hypothesis step S13 is determined (S17) as the final desired corrected surface form to be provided to the correcting member C. Then, in order to provide the desired corrected surface form determined in the decision step S17 to the correcting member C, correcting member C is worked (polishing and the like) (S18).

However, with the initial hypothesis of the corrected surface form, it is normal for the first evaluation function and the second evaluation function to be larger than the predetermined specified values, and in order to improve the residual aberrations in the projection optical system, following the NG arrow in FIG. 2, the parameters $A_{mn}\sim D_{mn}$ of the predetermined function S are changed (S19). Also, in normal cases, even if the first evaluation function and the second evaluation function are smaller than the predetermined specified value from the initially hypothesized corrected surface form, in order to further improve residual aberrations in the projection optical system, following the NG arrow in FIG. 2, the parameters $A_{mn}\sim D_{mn}$ of the predetermined function S are changed (S19).

In accordance with the changed parameters $A_{mn}\sim D_{mn}$ of the function S, the hypothesis step S13, the approximation step S14, the calculation step S15, and the evaluation step S16 are repeated. In particular, changing each parameter $A_{mn}\sim D_{mn}$ independently, for example, affects each parameter $A_{mn}\sim D_{mn}$ of the first evaluation function and the second evaluation function. In addition, referring to the information concerning the effect on each parameter $A_{mn}\sim D_{mn}$ of the first evaluation function and the second evaluation function, each parameter $A_{mn}\sim D_{mn}$ is finally determined when the first evaluation function and the second evaluation function have been made as small as possible.

Thus, in the case that the first evaluation function and the second evaluation function are smaller than their respective predetermined specified values with respect to the corrected surface form specified by each parameter $A_{mn}\sim D_{mn}$ finally determined by numerical analysis, following the OK arrow in FIG. 2, the corrected surface form is determined as the final desired corrected surface form to be provided to the correcting member C (S17). In order to provide the desired corrected surface form determined in the decision step S17 to the correcting member C, the correcting member C is worked (S18)

On the other hand, in the case that one or both of the first evaluation function and the second evaluation function with respect to the finally hypothesized corrected surface form are larger than the specified value, the process returns to the measurement step S11 after again adjusting (including exchanging) the optical member comprising the projection optical system 8. Then, the measurement step S12, the hypothesis step S13, the approximation step S14, the calculation step S15 and the evaluation step S16 are repeated.

In the working step S18, correcting member C disposed in the projection optical system 8 before working is removed, and using a specialized polishing machine as disclosed in, for example, FIG. 15 of U.S. Pat. No. 6,268,903, is polished so that the surface of one side of the correcting member becomes the desired surface form (the corrected surface form). At this point, local working is performed in the case that the working surface is a random aspherical form. Moreover, in the case that residual aberration in the projection optical system 8 is measured using a dummy measuring member, there is no need to remove the correcting member C from the projection optical system, and an optical member serving as the correcting member C before working is prepared beforehand having the same refraction ratio and the same thickness as that of the dummy measuring member, and the surface of the optical member is polished so that it becomes the required surface shape (the corrected surface shape). Also, a coating (an anti-reflective film and the like) as may be needed is applied to the worked surface (the corrected surface) of the polished correcting member C.

Figure 11:
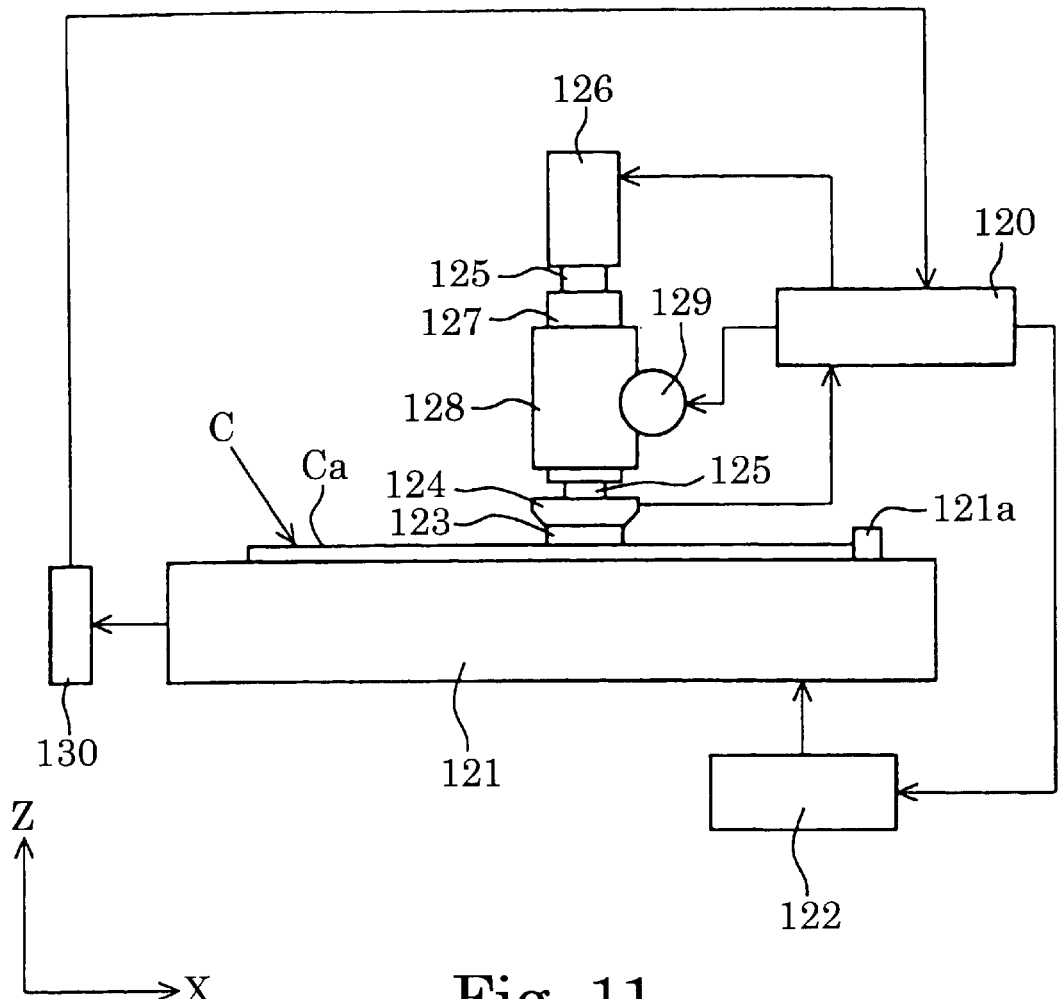
FIG. 11 is a schematic view showing the structure of a polisher used in the working step.

The polisher (the polishing device) and the polishing movement in the working step S18 will be described with reference to FIG. 11. In FIG. 11, the correcting member is disposed on the stage 121 movable in the XY direction, and the edge is abutted on pin 121a of the stage 121. The driving member 122 for driving along the XY direction of the stage 121 is controlled by the controlling unit 120. When the stage 121 moves, controlled by controlling unit 120, the detecting member 130 comprised of an encoder and an interferometer is set in relation to the stage 121 in order to detect the position on the XY direction. The detection signal from the detecting member 130 is transmitted to the controlling unit 120.

A polishing disc 123 is attached to one end of a rotating shaft 125 via protecting member 124, and is capable of rotation about the axis in the z direction in the diagram. The driving member 126 of a motor, and the like, controlled by the controlling unit 120 is attached to the opposite end of the rotating shaft 125. A bearing 127 rotation-freely supporting rotating shaft 125 is disposed in a movable manner in the Z direction against a supporting member 128 which is affixed to the main body (not shown in the diagram). A driving member 129 of a motor, and the like, controlled by the controlling unit 120 is attached to the supporting member 128, and the bearing 127 moves in the Z direction by the operation of the driving member 129 thereby moving the polishing disc 123 in the Z direction. Moreover, a sensor (not shown) for detecting the contact pressure between the polishing disc 123 and the correcting member C is disposed on the protecting member 124 holding the polishing disc 123, and the output signal from the sensor concerning the contact pressure is transmitted to the controlling unit 120.

Next, the operation of the polisher (polishing apparatus) in FIG. 11 will be described. First, the information concerning the final working surface form of the correcting member C obtained through the above steps S13–S18 is input to the controlling unit 120. After that, the controlling unit 120, while rotating the polishing disc 123, moves the stage 121 in the XY direction via the driving member 122. In other words, the polishing disc 123 moves so as to follow the workpiece surface Ca of the correcting member C in the XY direction. At this point, the quantity of polishing on the workpiece surface Ca of the correcting member is determined by the contact pressure between the workpiece surface Ca and the polishing disc 123, and/or by the polishing disc residence time.

Moreover, in the polisher (the polishing apparatus) in FIG. 11, the polishing disc 123 is fixed in the XY direction and the stage 121 is moved in the XY direction, however, the stage 121 may be fixed and the polishing disc 123 may move in the XYZ directions, and, in addition, the polishing disc 123 may be moved in the XYZ directions while the stage 121 may be moved in the XY directions. Also, the example in working step S18 is an example of polishing the workpiece surface Ca of the correcting member C using a polishing apparatus, however, if it is possible to work a workpiece into the desired surface form, the surface form may be obtained by working according to a method other than polishing.

Next, as required, the surface form of the work surface of the polished correcting member C is checked (S110). In the work surface checking step S110, the transmitted wavefront of the correcting member is measured using, for example, an interferometer, and the surface form of the work surface of the correcting member C is measured based on the measured transmission wavefront. Then, the aberration thought to be remaining in the projection optical system 8 based on the setting of the worked correcting member C is calculated by simulations using measurement data such as the wave surface form of the optical surface of each optical member of the projection optical system 8 including the correcting member C, center thickness, air space between each member, refraction ratio distribution, and the like.

After confirming that the residual aberrations calculated by the simulations using the above-described measurement data are in the desired condition, the worked correcting member C is disposed in a predetermined position in the projection optical system 8 (S111). In other words, the polished correcting member C is returned to the position in which the correcting member C before polishing had been disposed. Moreover, in the case of measuring residual aberrations in the projection optical system 8 using a dummy measuring member, after removing the dummy measuring member from the projection optical system 8, the polished correcting member C is inserted into and disposed inside the projection optical system. In other words, the polished correcting member C is set in the position in which the dummy measuring member was set.

On the other hand, in the case that residual aberrations calculated by the simulation using the above-described measurement data are not in the desired condition, the working step S18 and the work surface checking step S110 are repeated as necessary. Finally, as necessary, with the polished correcting member C disposed in the predetermined position in the projection optical system 8, residual aberrations in the projection optical system 8 from, for example, a test exposure are again measured, and residual aberrations to be corrected are confirmed for good correction. Then, in the case that residual aberrations to be corrected are confirmed for good correction, then the series of fabrication steps concerning the fabrication method in the preferred embodiment is complete.

It is possible to assemble an exposure apparatus in the preferred embodiment by electrically, mechanically and optically concatenating each optical member and each stage, and the like, in the preferred embodiment in FIG. 1 described above so as to achieve the above-described function. In other words, the mask stage, the wafer stage and the illumination system (the light source and the illumination optical system) are set in the exposure apparatus main body, and the projection optical system fabricated according to the fabrication method in the preferred embodiment is set in the exposure apparatus main body at the time of exposure apparatus manufacture.

In the preferred embodiment as described above, the final desired corrected surface form is obtained by changing the parameters of the Fourier function so as to sufficiently reduce the residual distortion aberration and the residual wavefront aberration (such that the residual aberration is improved) after hypothesizing beforehand the corrected form to be provided to the correcting member C based on the Fourier function. Therefore, in the preferred embodiment, it is possible to determine the desired corrected surface form to be provided to the correcting member as a continuous surface in order to correct aberrations remaining in the projection optical system. It is possible to excellently correct distortion aberrations remaining in the projection optical system, and to excellently control wavefront aberrations secondarily generated with aberration correction.

In the preferred embodiments as described above, a predetermined surface slope, at each correction point where a principle ray shot into each measurement point in the optical field passes through the correcting member, is not calculated based on the measurements of the image aberration characteristics. The above preferred embodiments do not require connecting average planes which take into account the number of light beam apertures corresponding to each region on the correcting member.

In the preferred embodiment, the correcting member is disposed in the optical path between the mask and the mask side of the lenses; the invention, however, is not limited to this. It is also possible to, for example, dispose the correcting member in the optical path between the wafer and the wafer side of the lens component in the projection optical system. However, in a reduction projection-type projection optical system, it is preferred that the correcting member be disposed in the optical path between the mask and the mask side of the lenses in the projection optical system because the number of apertures on the wafer side of the projection optical system is large and the overlap of each evaluation region in the correcting member becomes large, and because the space between the wafer side of the lens component in the projection optical system and the wafer is quite small.

In the preferred embodiment, a plane-parallel form optical member serving as the correcting member is used; the invention, however, is not limited to this. It is also possible to, for example, use a lens component on the mask side of the projection optical system, or a lens component on the wafer side as a correcting member. In this case as well, in a reduction projection-type projection optical system it is preferred to provide a lens component on the mask side, rather than a lens component on the wafer side, because the number of apertures on the wafer side of the projection optical system is large and the overlap of each evaluation region on the correcting member becomes large. Furthermore, in the invention, it is also possible to form a corrected surface obtained through the above steps S13~S18 on the surface (a surface with power, a surface without power, and the like) of an optical member itself inside the projection optical system to serve as an optical member comprising a projection optical system, in other words, an optical member (a lens with a spherical surface, a reflecting member with a spherical surface form reflective surface, and the like) contributing to image formation.

In the above-described preferred embodiment, the surface on the mask side of the correcting member is worked as the corrected surface; the invention, however, is not limited to this. It is also possible to work the surface on the wafer side of the correcting member, or both surfaces as the corrected surface. Also, in the above-described preferred embodiment, distortion aberrations from the effect of the correcting member is corrected; the invention, however, is not limited to this. It is also possible to correct other aberrations. Furthermore, in the above-described preferred embodiment, one correcting member is used, however, it is also possible to use a plurality of correcting members.

Also, in the preferred embodiment, the invention is applied to the fabrication method for the projection optical system installed in the exposure apparatus; the invention, however, is not limited to this. It is also possible to apply the invention to the fabrication method of a common projection optical system which projects an image of a first surface onto a second surface. Furthermore, in the preferred embodiment, the invention is applied to the fabrication method for the projection optical system in an exposure apparatus; the invention, however, is not limited to this. It is also possible to apply the invention to the fabrication method for the correcting member for correcting residual aberrations in any projection optical system.

In the exposure apparatus in the preferred embodiment, it is possible to fabricate microdevices (semiconductor elements, image pickup devices, liquid crystal display devices, thin film magnetic heads, and the like) by illuminating (the illumination step) a mask (a reticle) via an illumination optical system, and exposing (the exposure step) a pattern for transfer formed on a mask to a photosensitive substrate using a projection optical system. Next, referring to the flowchart in FIG. 12, an example of a method, when obtaining a semiconductor device serving as a microdevice, for forming a predetermined circuit pattern on a wafer, and the like, serving as a photosensitive substrate using the exposure device in the preferred embodiment will be described.

Figure 12:
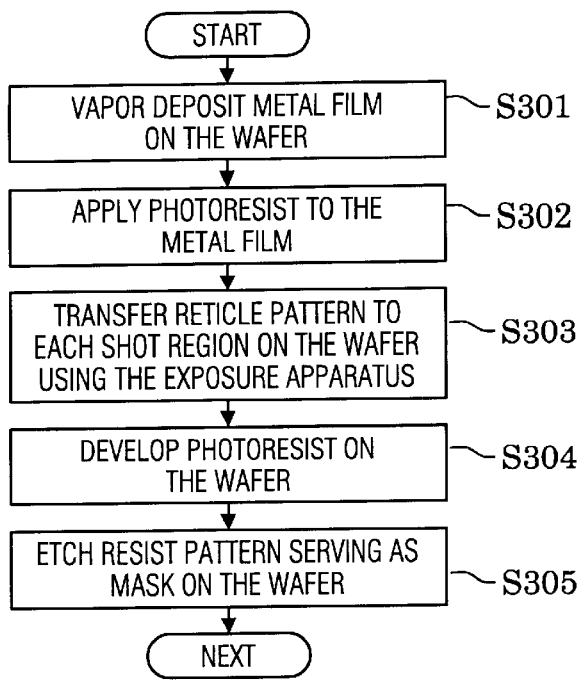
FIG. 12 is a flowchart showing an example of the technique used when obtaining a semiconductor device serving as a microdevice.

First, in step S301 of FIG. 12, a metal film is vapor deposited on one lot of wafers. Next, in step S302, a photoresist is applied to the metal film on the lot of wafers. After that, in step S303, using the exposure apparatus in the preferred embodiment, the image of a pattern on a mask (a reticle) is consecutively exposure transferred to each shot region on the lot of wafers via the projection optical system (the projection optical unit) PL.

After that, in step S304, after the photoresist on the lot of wafers is developed, the circuit pattern corresponding to the pattern on the mask is formed on each shot region on each wafer by etching, in step S305, the resist pattern serving as a mask on the lot of wafers. After that, a semiconductor element, and the like, is fabricated by performing circuit pattern formation, and the like, on successive layers. According to the above-described semiconductor device fabrication method, it is possible to obtain, with good throughput, a semiconductor device having a very detailed, high resolution circuit pattern.

In the exposure apparatus in the preferred embodiment, it is possible to obtain a liquid crystal display element serving as a microdevice by forming a predetermined pattern (a circuit pattern, an electrode pattern, and the like) on a plate (e.g., a glass or quartz substrate). Below, referring to the flowchart in FIG. 13, the method in this process will be described.

Figure 13:
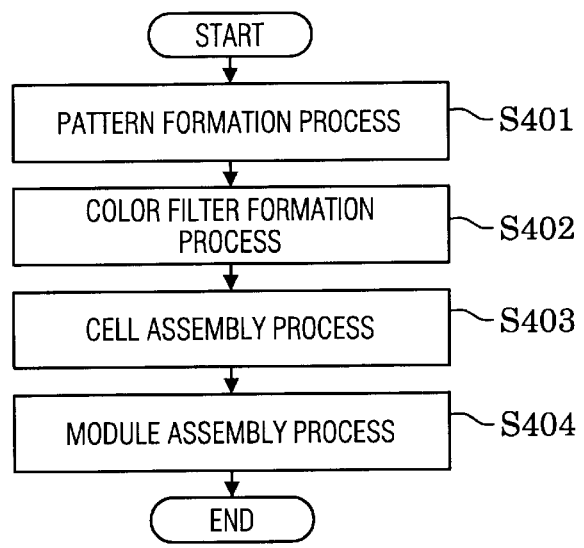
FIG. 13 is a flowchart showing an example of the technique used when obtaining a liquid crystal display element serving as a microdevice.

In FIG. 13, the so-called photolithography step, which transfer exposes a mask (a reticle) pattern to a photosensitive substrate (a glass substrate with a resist applied) using the exposure apparatus in the preferred embodiment, is performed in the pattern formation step S401. A predetermined pattern containing a plurality of electrodes, and the like, are formed on the photosensitive substrate in the photolithography step. After that, by passing the exposed pattern through each of the development step, the etching step, the reticle separation step, and the like, the predetermined pattern is formed on the substrate, and the process moves to the color filter formation step S402.

Next, in the color filter formation step S402, a plurality of sets of three dots corresponding to R (Red), G (Green), and B (Blue) are arranged in a matrix form, or sets of three stripe filters of R, G, B arranged in the direction of a plurality of horizontal scan lines to form a color filter. After the color filter formation step S402, the cell assembly step S403 is executed.

In the cell assembly step, a liquid crystal panel (a liquid crystal cell) is assembled using the substrate having a predetermined pattern obtained in the pattern formation step S401, and the color filter obtained in the color filter formation step S402. In the cell assembly step S403, a liquid crystal material is injected between the substrate having a predetermined pattern obtained in the pattern formation step S401 and the color filter obtained in the color filter formation step S402, for example, thereby fabricating a liquid crystal panel (a liquid crystal cell).

After that, in the module assembly step S404, each part, an electric circuit for display operating the assembled liquid crystal display (the liquid crystal cell), a backlight, and the like, are attached, completing a liquid crystal display element. According to the above-described liquid crystal display element fabrication method, it is possible to obtain, with good throughput, a liquid crystal display element having a very detailed pattern.

In the above-described preferred embodiment, a KrF excimer laser supplying 248 nm light and an ArF excimer laser supplying 193 nm light serving as light sources were used; the invention, however, is not limited to these. It is also possible to use an $F_2$ laser supplying 157 nm light, an extra-high mercury lamp, and the like to serve as a light source. Here, in the case that a KrF excimer laser serves as a light source, quartz glass is used to serve as a refractive optical element in the projection optical system when the exposure light is narrowed, and quartz glass and fluorspar are used to serve as a refractive optical element in the projection optical system when the exposure light is not narrowed for increasing the quantity of exposure light. Also, in the case the an ArF excimer laser serves as a light source, quartz glass and fluorspar are used to serve as a refractive optical element in the projection optical system. In the case the a $F_2$ excimer laser serves as a light source, fluorspar is used to serve as a refractive optical element in the projection optical system.

In the preferred embodiment, the invention is applied to the projection optical system designed for holding a correcting member, and to the initial adjustment in the fabrication of the exposure apparatus. However, it is possible to apply the invention to a projection optical system not designed for holding a correcting member, and to the initial adjustment (for a retrofit) in the fabrication of an exposure apparatus. In this case, as disclosed in, for example, Japanese Laid-Open Patent Application Publication No. 11-345551, when newly inserting the correcting member, it is necessary to readjust the object-to-image distance (the distance between the mask and the substrate). Moreover, it is possible that residual aberrations in a projection optical system will change over time due to usage. Therefore, whether designed for holding a correcting member or not, residual aberrations in a projection optical system are continuously measured, and, as required, adjustments may be made according to the invention. In this case, adjustment after using the projection optical system and the exposure apparatus for a predetermined quantity of time is made in the same manner as the initial adjustment at fabrication.

In the above-described preferred embodiment, an example applying a correcting member C according to the invention to a projection optical system (a refractive optical system) comprised of a plurality of refractive optical members (lenses, and the like) was shown. However, it is possible to apply a correcting member C according to the invention in the case that the projection optical system 8 is a catadioptric optical system comprised of a combination of refractive optical members (lenses, and the like) and reflective optical components (concave reflective mirrors, convex reflective mirrors, and the like), and also in the case that the projection optical system 8 serves as a reflective optical system comprised of only reflective optical members (concave reflective mirrors, convex optical mirror, and the like)

As described above, in the invention, the final desired corrected surface form is obtained by changing the parameters of the functions as required so that the residual aberration and the residual wavefront aberration become sufficiently small having hypothesized beforehand the corrected surface form to be provided to the correcting member based on predetermined functions. Therefore, with the projection optical system and the fabrication method for an exposure apparatus in the invention, it is possible to easily determine the desired corrected surface form to be provided to the correcting member as a continuous surface for correcting residual aberrations.

With the projection optical system and the fabrication method for the exposure apparatus in the invention, it is possible to excellently correct predetermined aberrations such as residual distortion aberrations, and to excellently manage wavefront aberrations secondarily generated with aberration correction. Also, it is possible to manufacture excellent microdevices using an exposure apparatus provided with a projection optical system fabricated and adjusted according to the invention, in other words, using an exposure apparatus provided with a projection optical system with excellently corrected residual aberrations and having high optical characteristics.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A fabrication method for a correcting member for correcting residual aberration in a projection optical system that projects an image of a first surface onto a second surface, the fabrication method comprising:

a measurement step of measuring aberration remaining in the projection optical system;

a hypothesis step of hypothesizing a corrected surface form to be provided to the correcting member based on predetermined functions;

a calculation step of calculating wavefront information of a light beam which passes through each of a plurality of regions on the correcting member having the corrected surface form hypothesized in the hypothesis step; and an evaluation step of evaluating the remaining aberration in the projection optical system when the hypothesized corrected surface form hypothesized in the hypothesis step is provided to the correcting member based on the measurement result in the measurement step and on the wavefront information calculated in the calculation step.

2. A fabrication method according to claim 1, wherein the measurement step includes:

a first measurement step of measuring predetermined aberration remaining in the projection optical system, and a second measurement step of measuring wavefront aberration remaining in the projection optical system.

3. A fabrication method according to claim 2, wherein the evaluation step includes:

a first evaluation step of evaluating the predetermined aberration remaining in the projection optical system when the corrected surface form hypothesized in the hypothesis step is provided to the correcting member based on the measurement results of the predetermined aberration measured in the measurement step and on the wavefront information calculated in the calculation step, and a second evaluation step of evaluating the wavefront aberration, not including the predetermined aberration component, remaining in the projection optical system when the corrected surface form hypothesized in the hypothesis step is provided to the correcting member based on the measurement results of wavefront aberration measured in the measurement step and on the wavefront information calculated in the calculation step.

4. A fabrication method according to claim 1, wherein the measurement step includes:
   a wavefront aberration measurement step of measuring wavefront aberration remaining in the projection optical system, and
   an extraction step of extracting predetermined aberration components by analyzing the wavefront aberration measured in the wavefront aberration measurement step.

5. A fabrication method according to claim 1, wherein the measurement step measures each aberration at a plurality of measurement points in a projection field of the projection optical system.

6. A fabrication method according to claim 5, wherein each region of the correcting member:
   is the center of each evaluation point that the principle ray, shot into each measurement point in the projection optical field of the projection optical system, passes through the correcting member, and
   is defined as a region through which a light beam reaching the second surface, including the principle ray, will pass.

7. A fabrication method according to claim 1, wherein the measurement step includes a step of measuring distortion aberration as the aberration.

8. A fabrication method according to claim 1, wherein the measurement step measures aberration remaining in the projection optical system with the correcting member set in the optical path before working the correcting member.

9. A fabrication method according to claim 1, wherein the measurement step measures aberration remaining in the projection optical system with a dummy measuring member, having the same light characteristics as the correcting member before working, set in the optical path.

10. A fabrication method according to claim 1, wherein the calculation step:
    includes an approximation step of approximating the corrected surface form with a Zernike function for each region of the correcting member having a corrected surface form hypothesized in the hypothesis step, and
    calculates changes in the wavefront of the light beam wavefront which passes through each region based on the Zernike function approximated in the approximation step.

11. A fabrication method according to claim 1, wherein the hypothesis step hypothesizes a corrected surface form to be provided to the correcting member based on a Fourier function, a Zernike function and an exponential function.

12. A fabrication method according to claim 1, wherein the hypothesis step initially hypothesizes a corrected surface form as a predetermined curved surface to be provided to the correcting member based on the measurement results in the measurement step.

13. A fabrication method according to claim 1, wherein the hypothesis step initially hypothesizes a corrected surface form as a plane to be provided to the correcting member.

14. A fabrication method according to claim 1, wherein the correcting member is an optical member with a plane-parallel form placed:
    in the optical path between a lens component positioned on a first surface of the projection optical system and the first surface, or
    in the optical path between a lens component positioned on a second surface of the projection optical system and the second surface.

15. A fabrication method according to claim 1, wherein the correcting member is a lens component placed on a first surface or a second surface of the projection optical system.

16. A fabrication method according to claim 1, wherein the fabrication method includes a corrected surface form decision process which obtains a final corrected surface form by modifying the parameters of the predetermined functions and repeating the hypothesis step, the calculation step and the evaluation step in order to improve residual aberrations in the projection optical system.

17. A fabrication method according claim 16, wherein the fabrication method includes a working step for working the surface of the correcting member in order to provide to the correcting member a final corrected surface form obtained in the corrected surface form decision process.

18. A fabrication method according to claim 16, wherein the fabrication method includes a working step to work the surface of the correcting member in order to provide to the correcting member a final corrected surface form obtained in the corrected surface form decision process, and a placement step for placing the correcting member, which has been worked in the working step, between the first surface and the second surface.

19. A correcting member fabricated by the method according to claim 1.

20. A fabrication method for a projection optical system for projecting an image of a first surface onto a second surface, the fabrication method comprising:
    a measurement step of measuring residual aberration remaining in the projection optical system;
    a hypothesis step of hypothesizing a corrected surface form to be provided to a correcting member in order to correct the residual aberration in the projection optical system;
    a calculation step of calculating wavefront information of a light beam which passes through each of a plurality of regions on the correcting member having the corrected surface form hypothesized in the hypothesis step; and
    an evaluation step of evaluating the aberration remaining in the projection optical system to be provided to the correcting member based on the measurement result in the measurement step and on the wavefront information calculated in the calculation step.

21. A projection optical system fabricated by the method according to claim 20.

22. A fabrication method for an exposure apparatus which includes:
    a first placement step of placing a mask stage, for disposing a mask on the first surface, on a main body of an exposure apparatus;
    a second placement step of placing a substrate stage, for disposing a photosensitive substrate on the second surface, on the main body of an exposure apparatus;
    a third placement step of placing a projection optical system, fabricated according to claim 20, on the main body of an exposure apparatus; and
    a fourth placement step of placing an illumination system, for illuminating the mask disposed on the first surface, on the main body of an exposure apparatus.

23. A fabrication method for a microdevice which includes:
    an exposure step of exposing the mask pattern onto a photosensitive substrate using an exposure apparatus fabricated according to the fabrication method of claim 22, and
    a development step of developing the photosensitive substrate exposed in the exposure step.

24. An exposure apparatus fabricated by the method according to claim 22.

25. A fabrication method according to claim 20, wherein the measurement step includes:
   a first measurement step of measuring a predetermined aberration remaining in the projection optical system; and
   a second measurement step of measuring a wavefront aberration remaining in the projection optical system.

26. A fabrication method according to claim 20, wherein the measurement step includes:
   a wavefront aberration measurement step of measuring the wavefront aberration remaining in the projection optical system; and
   an extraction step of extracting predetermined aberration components by analyzing the wavefront aberration measured in the wavefront aberration measurement step.

27. A fabrication method according to claim 20, wherein the measurement step measures each aberration at a plurality of measurement points in a projection field of the projection optical system.

28. A fabrication method according to claim 20, wherein the measurement step measures aberration remaining in the projection optical system with the correcting member set in the optical path before working the correcting member.

29. A fabrication method according to claim 20, wherein the measurement step measures an aberration remaining in the projection optical system with a dummy measuring member, having a same light characteristic as the correcting member before working, set in the optical path.

30. A fabrication method according to claim 20, wherein the evaluation step includes:
   a first evaluation step of evaluating the predetermined aberration remaining in the projection optical system when the corrected surface form hypothesized in the hypothesis step is provided to the correcting member based on the measurement results of the predetermined aberration measured in the measurement step and on the wavefront information calculated in the calculation step; and
   a second evaluation step of evaluating the wavefront aberration, not including a predetermined aberration component, remaining in the projection optical system when the corrected surface form hypothesized in the hypothesis step is provided to the correcting member based on the measurement results of wavefront aberration measured in the measurement step and on the wavefront information calculated in the calculation step.

31. A fabrication method according to claim 20, wherein the calculation step includes:
   an approximation step of approximating the corrected surface form with a Zernike function for each region of the correcting member having a corrected surface form hypothesized in the hypothesis step; and
   calculates changes in the wavefront of the light beam wavefront which passes through each region based on the Zernike function approximated in the approximation step.

32. A fabrication method according to claim 20, wherein the hypothesis step hypothesizes a corrected surface form to be provided to the correcting member based on a Fourier function, a Zernike function and an exponential function.

33. A fabrication method according to claim 20, wherein the hypothesis step initially hypothesizes a corrected surface form as a plane to be provided to the correcting member.

34. A fabrication method according to claim 20, wherein the correcting member is an optical member with a plane-parallel form placed in at least one of:
   the optical path between a lens component positioned on a first surface of the projection optical system and the first surface; and
   the optical path between a lens component positioned on a second surface of the projection optical system and the second surface.

35. A fabrication method according to claim 20, wherein the correcting member is a lens component placed on a first surface or a second surface of the projection optical system.

36. A fabrication method according to claim 20, wherein the fabrication method includes a corrected surface form decision process which obtains a final corrected surface form by modifying parameters of predetermined functions and repeating the hypothesis step, the calculation step and the evaluation step in order to improve residual aberrations in the projection optical system.

37. A fabrication method according claim 20, wherein the fabrication method includes a working step of working the surface of the correcting member in order to provide to the correcting member a final corrected surface form obtained in the corrected surface form decision process.

38. A fabrication method according to claim 20, wherein the fabrication method includes: a working step to work the surface of the correcting member in order to provide to the correcting member a final corrected surface form obtained in the corrected surface form decision process; and a placement step of placing the correcting member, which has been worked in the working step, between the first surface and the second surface.

39. An adjustment method of an exposure apparatus having a projection optical system for projecting a pattern of a mask onto a photosensitive substrate, the adjustment method including:
   a measurement step of measuring remaining aberration in the projection optical system;
   a hypothesis step of hypothesizing, based on predetermined functions, a corrected surface form to be provided to a correcting member;
   a calculation step of calculating wavefront information of a light beam which passes through each of a plurality of regions on the correcting member having the corrected surface form hypothesized in the hypothesis step; and
   an evaluation step of evaluating the remaining aberration in the projection optical system when the hypothesized corrected surface form hypothesized in the hypothesis step is provided to the correcting member based on the measurement result in the measurement step and on the wavefront information calculated in the calculation step.

40. An adjustment method according to claim 39, wherein the measurement step includes a first measurement step of measuring a predetermined aberration remaining in the projection optical system, and a second measurement step of measuring a wavefront aberration remaining in the projection optical system.

41. An adjustment method according to claim 40, wherein the evaluation step includes:
   a first evaluation step of evaluating the predetermined aberration remaining in the projection optical system when the corrected surface form hypothesized in the hypothesis step is provided to the correcting member based on the measurement results of the predetermined aberration measured in the measurement step and on the wavefront information calculated in the calculation step, and a second evaluation step of evaluating the wavefront aberration, not including the predetermined aberration component, remaining in the projection optical system when the corrected surface form hypothesized in the hypothesis step is provided to the correcting member based on the measurement results of wavefront aberration measured in the measurement step and on the wavefront information calculated in the calculation step.

42. An adjustment method according to claim 39, wherein the measurement step includes a wavefront aberration measurement step of measuring a wavefront aberration remaining in the projection optical system, and an extraction step of extracting predetermined aberration components by analyzing the wavefront aberrations measured in the wavefront aberration measurement step.

43. An adjustment method according to claim 39, wherein the measurement step measures each aberration in a plurality of measurement points in the projection optical field of the projection optical system.

44. An adjustment method according to claim 43, wherein each region of the correcting member is the center of each evaluation point that the principle ray, shot into each measurement point in the projection optical field of the projection optical system, passes through the correcting member defined as a region through which a light beam reaching the second surface, including the principle ray, will pass.

45. An adjustment method according to claim 39, wherein the measurement step includes a step for measuring distortion aberrations as the aberrations.

46. An adjustment method according to claim 39, wherein the calculation step:

includes an approximation step of approximating the corrected surface form with a Zernike function for each region of the correcting member having the corrected surface form hypothesized in the hypothesis step, and calculates changes in the wavefront of the light beam wavefront which passes through each region based on the Zernike function approximated in the approximation step.

47. An adjustment method according to claim 39, wherein the hypothesis step hypothesizes a corrected surface form to be provided to the correcting member based on a Fourier function, a Zernike function and an exponential function.

48. An adjustment method according to claim 39, wherein the hypothesis step initially hypothesizes a corrected surface form as a predetermined curved surface to be provided to the correcting member based on the measurement results in the measurement step.

49. An adjustment method according to claim 39, wherein the hypothesis step initially hypothesizes a corrected surface form as a plane to be provided to the correcting member.

50. An adjustment method according to claim 39, wherein the adjustment method includes a corrected surface form decision process which obtains a final corrected surface form by modifying parameters of the predetermined functions and repeating the hypothesis step, the calculation step and the evaluation step in order to improve residual aberrations in the projection optical system.

51. An adjustment method according to claim 50, wherein the adjustment method includes a working step to work the surface of the correcting member in order to provide to the correcting member a final corrected surface form obtained in the corrected surface form decision process, and a placement step of placing the correcting member, which has been worked in the working step, between the first surface and the second surface.

52. A fabrication method for a microdevice which includes:

an exposure step of exposing the mask pattern onto a photosensitive substrate using an exposure apparatus adjusted according to the adjustment method in claim 39, and a development step of developing the photosensitive substrate exposed in the exposure step.

53. An exposure apparatus adjusted by the method according to claim 39.

* * * * *